United States Patent [19]

Tani

[11] Patent Number: 5,345,401
[45] Date of Patent: Sep. 6, 1994

[54] LOGIC CIRCUIT SIMULATOR FOR VERIFYING CIRCUIT OPERATIONS HAVING MOS TRANSISTORS

[75] Inventor: Takahiro Tani, Itami, Japan

[73] Assignee: Mitsubishi Denki Kabushiki Kaisha, Tokyo, Japan

[21] Appl. No.: 958,165

[22] Filed: Oct. 8, 1992

[30] Foreign Application Priority Data

Apr. 27, 1992 [JP] Japan .................................. 4-107439

[51] Int. Cl.$^5$ .......................................... G06F 15/60
[52] U.S. Cl. .................................. 364/578; 364/488; 364/489; 364/490; 364/491; 371/23
[58] Field of Search ............... 364/488, 489, 490, 491, 364/578; 371/23

[56] References Cited

U.S. PATENT DOCUMENTS

| | | | |
|---|---|---|---|
| 5,016,204 | 5/1991 | Simoudis et al. .................... | 364/578 |
| 5,051,911 | 9/1991 | Kimura et al. ....................... | 364/578 |
| 5,202,841 | 4/1993 | Tani ..................................... | 364/491 |
| 5,293,327 | 3/1994 | Ikeda et al. ......................... | 364/578 |

OTHER PUBLICATIONS

Principles of CMOS VLSI Design, Oct. 1985, N. Weste, et al., Chapter 2.2 pp. 39-43, "MOS Device Design Equations", Chapter 2.5, pp. 55-57, Transmission Gate-DC Characteristics, Chapter 4.3, pp. 122-130, Capacitance Estimation.

Primary Examiner—Jack B. Harvey
Assistant Examiner—Kyle J. Choi
Attorney, Agent, or Firm—Oblon, Spivak, McClelland, Maier & Neustadt

[57] ABSTRACT

A MOST output signal determiner (4) with output signal strength verifying function receives a circuit connection data (D4) with MOS input information to determine the signal strength of an output signal which appears at an output terminal (drain or source) of an MOS transistor as a function of an input signal. A logic simulator verifies circuit operating characteristics in consideration for signal transmitting characteristics on the input signal of the MOST, the presence/absence of a through current in the MOST and an accurate state transition delay time through the MOST.

16 Claims, 28 Drawing Sheets

LOGIC CIRCUIT SIMULATOR FOR VERIFYING CIRCUIT OPERATIONS HAVING MOS TRANSISTORS

BACKGROUND OF THE INVENTION

1. Field of the Invention

The present invention relates to a logic simulator for verifying circuit operating characteristics of a logic circuit including MOS transistors.

2. Description of the Background Art

FIG. 19 is a block diagram of a conventional logic simulator for a logic circuit including MOS transistors. FIGS. 20 to 23 are flow charts of the verification of the circuit operating characteristics by the logic simulator of FIG. 19.

The verification of the circuit operating characteristics by the logic simulator of FIG. 19 will be described hereinafter with reference to FIGS. 20 to 23.

A circuit connection data providing means not shown applies to an event generator 102 a circuit connection data D1 which specifies circuit connections in the logic circuit to be simulated in the step S101. An input pattern signal providing portion 101 applies to the event generator 102 an input pattern signal D2 which becomes a test pattern in the step S102.

In the step S103, the event generator 102 generates a signal value change (or an event) as a function of the input pattern signal D2 in signal lines in the logic circuit which are specified by the circuit connection data D1, to output a circuit connection data D3 with event information to an MOST (transistor) input signal extractor 103.

In the step S104, the MOST input signal extractor 103 extracts an MOS transistor having an input terminal (drain or source) connected to a wiring (or a net) in which the event is generated from the circuit connection data D3 while recognizing the conductivity type of the MOS transistor. The MOST input signal extractor 103 also extracts signal values applied to the input and gate terminals of the MOS transistor, to output a circuit connection data D4 with MOS input information to an MOST output signal determiner 104.

In the step S105, the MOST output signal determiner 104 determines an output signal value which appears at the output terminal (drain or source) of the MOS transistor as a function of the circuit connection data D4, to output a circuit connection data D5 with MOS output information to an on-net signal value processor 105. The determination will be described below with reference to FIG. 21.

The MOS (conductivity) type of the MOS transistor having the input terminal at which the event is generated (hereinafter referred to as an "event generation MOST") is identified in the step S111. The process proceeds to the step S112 when the MOS type is P, and the process proceeds to the step S113 when the MOS type is N.

A gate signal value of the P type event generation MOST is judged in the step S112. The process proceeds to the step S114 when the gate signal value is at high impedance (Z) or indefinite (X). The process proceeds to the step S115 when the gate signal value is "1" (at H level), and proceeds to the step S117 when it is "0" (at L level). At the same time, a gate signal value of the N type event generation MOST is judged in the step S113. The process proceeds to the step S116 when the gate signal value is at high impedance (Z) or indefinite (X).

The process proceeds to the step S115 when the gate signal value is "0", and proceeds to the step S117 when it is "1".

In the steps S114 and S116, the ON/OFF state of the event generation MOST is regarded as indefinite, so that an indefinite signal X is outputted. In the step S115, the event generation MOST is regarded as OFF, so that a high-impedance signal Z is outputted. In the step S117, the event generation MOST is regarded as ON, the input signal is outputted as it is.

After the output signal value of the event generation MOST is determined in one of the steps S114 to S117, the process proceeds to the step S106 of FIG. 20.

In the step S106 of FIG. 20, the on-net signal value processor 105 determines the signal values of a net which is in a signal competing condition from the circuit connection data D5, to output a net-processed circuit connection data D6 to a simulation time controller 106. The net processing is described below with reference to FIG. 22.

It is detected in the step S121 whether or not the net to which the output signal of the event generation MOST is applied is in the signal competing condition. The process proceeds to the step S122 when it is in the signal competing condition, and the process proceeds to the step S123 when it is not.

In the step S122, the value of a signal having the maximum signal strength among a plurality of signals which compete with each other is determined as a net signal value. The process then proceeds to the step S107 of FIG. 20. The signal strength denotes a drive capability of the transistors composing the logic circuit as a function of transistor size.

In the step S123, since the net connected to the output signal of the event generation MOST is not in the signal competing condition, the output signal value of the event generation MOST is determined intactly as the net signal value. The process then proceeds to the step S107 of FIG. 20.

The simulation time controller 106 carries out a simulation time control processing as a function of the net-processed circuit connection data D6 in the step S107 of FIG. 20. When it is necessary to continue the simulation, the simulation time controller 106 outputs a circuit connection data D7 with simulation time to the event generator 102 to instruct to continue the simulation. When it is judged that the simulation is completed, the process proceeds to the step S108 of FIG. 20. The simulation time control processing will be described below with reference to FIG. 23.

It is checked whether or not the event generation is completed at the current simulation time. When it is judged that the event generation is not completed, the process proceeds to the step S103 of FIG. 20 to continue the simulation without changing the simulation time.

When it is judged that the event generation is completed in the step S125, the process proceeds to the step S126. It is checked in the step S126 whether or not the simulation time is a (simulation) finish time. When it is, the process proceeds to the step S108 of FIG. 20 to complete the simulation.

When it is not, the simulation time is put forward in the step S127. The process then proceeds to the step S103 of FIG. 20 so that the event generator 102 generates a new event with the renewed simulation time to continue the simulation.

The process returns to the step S103 when it is judged to continue the simulation in the step S107 of FIG. 20. The event generation, extraction of the input signal of the MOST, determination of the output signal of the MOST, on-net signal value processing and simulation time control processing are continued as a function of the circuit connection data D7 in the steps S103 to S107, until the completion of the simulation is recognized in the step S107.

The process proceeds to the step S108 when it is judged in the step S107 that the simulation is completed. In the step S108, an simulation result output means not shown outputs to a CRT not shown or the like a simulation result list including signal names, event generation time, signal values and the like as a function of a circuit connection data D8 with whole event information.

FIG. 28 is a block diagram of a conventional logic simulator in which the signal strength is taken into consideration. Reference numeral 201 designates a circuit connection data storing portion provided in a computer and for storing a circuit connection data a equivalent to the logic circuit; 202 designates a signal strength data providing portion for setting, to the circuit connection data a, a signal strength data serving as relative representation of electrical charge providing capability for the logic simulation; 203 designates a logic simulation executing portion at plural signal strength level which is capable of handling the signal strength data; 204 designates a simulation result output portion for outputting the execution result of the logic simulation to a CRT, printer or the like; 205 designates a circuit constant data providing portion for setting a circuit constant value for circuit simulation to the circuit connection data a; 206 designates a circuit simulation executing portion which is capable of handling the circuit constant; and 207 designates a simulation result output portion for outputting the execution result of the circuit simulation to the CRT, printer or the like.

The function of the prior art will be discussed hereinafter with reference to FIGS. 28, 29 and 30.

FIG. 29 is a circuit diagram of an exemplary circuit connection data for logic circuit simulation. Reference numeral 108 designates an inverter logic element model; 109 designates a tri state buffer element model for outputting logical signals 1, 0 and high impedance; 110 designates a data input signal line for the tri state buffer 109; 111 designates an input signal line for controlling data transmission (1 and 0 outputs) or non-transmission (high impedance) for the tri state buffer 109; 112 designates an NMOS transistor element model; 113 designates a forced reset input signal line connected to the gate terminal of the NMOS transistor 112; 114 designates a ground element model connected to the source terminal of the NMOS transistor 112; 115 designates a signal line which causes signal value competition; 116 designates an inverter logic element model; and 117 designates an output signal line of a data latch circuit with reset function which includes the foregoing element models. FIG. 30 shows a logical construction of the tri state buffer 109. Reference character 118a designates a power supply terminal; and 118b designates earth.

The function of the conventional logic simulator on the circuit connection data shown in FIGS. 29 and 30 will be described below. A circuit designer manually sets the signal strength data required to operate the circuit to the respective element models composing the circuit by means of the signal strength data providing portion 202 of FIG. 28. That is, he sets a low strength level (weak) to the inverter 108, a medium strength level (medium) to the tri state buffer 109, and a high strength level (strong) to the NMOS transistor 112. An input signal is applied to the circuit connection data to which the signal strength data are applied, whereby the logic simulation executing portion 203 executes the logic simulation. The simulation result output portion 204 outputs the result of the simulation to verify the circuit design at a logical level.

For design verification at a circuit level, the circuit constant value is set to the circuit connection data a by means of the circuit constant data providing portion 205. Channel length $L_{p1}$ and channel width $W_{p1}$ of a PMOS transistor and channel length $L_{n1}$ and channel width $W_{n1}$ of an NMOS transistor are set to the inverter 108 of FIG. 29. Channel length $L_{p2}$ and channel width $W_{p2}$ of the PMOS transistor and channel length $L_{n2}$ and channel width $W_{n2}$ of the NMOS transistor are set to the tri state buffer 109. Channel length $L_{n3}$ and channel width $W_{n3}$ of the NMOS transistor are set to the NMOS transistor 112. Channel length $L_{p4}$ and channel width $W_{p4}$ of the PMOS transistor and channel length $L_{n4}$ and channel width $W_{n4}$ of the NMOS transistor are set to the inverter 116.

Next, the input signal is applied to the circuit connection data to which the circuit constant data are applied, whereby the circuit simulation executing portion 206 of FIG. 28 executes the circuit simulation. The simulation result output portion 207 outputs the result of the simulation, so that the circuit design is verified at the circuit level.

The conventional logic simulator of FIG. 19 for the logic circuit including the MOS transistors is constructed as above mentioned. The output signal of the event generation MOST is determined on the MOS type, input signal value and gate signal value in the conventional logic simulator, as shown in the flow chart Of FIG. 21.

The output signal of the MOS transistor has the signal strength which is fixed depending on the transistor size. Disadvantageously, the signal transmitting characteristics of the MOS transistor, i.e., dynamic change in ON-resistance with the input signal value is not taken into consideration for the signal strength verification.

The signal level (or voltage level) of the output signal is insufficient in some cases where the ON-resistance of the MOS transistor is outputted in a relatively high resistive condition. The MOS transistor having the gate input of the insufficient voltage might not be turned off when it should be, resulting in a through current (source to ground current) flow. A through current means a current flowing from source to ground through a transistor insufficiently turned off. There arises a problem that the presence/absence of the danger that the through current is produced is not taken into consideration for the simulation.

In the conventional logic simulator, a state transition delay time between the appearances of the input and output signals of the MOS transistor is not taken into account at all. If considered, the state transition delay time is fixed in the simulation. This causes a problem that the state transition delay time of the input and output signals of the MOS transistor is not correctly calculated for the simulation.

The conventional logic simulator in which the signal strength is taken into consideration is constructed as shown in FIG. 28. For the design verification of the logic circuit by means of the logic simulation and circuit simulation, it is necessary to manually apply, to the circuit connection data a, the signal strength for the logic simulation and the circuit constant for the circuit simulation as circuit informations separately for the respective simulation systems. A large amount of manual work is required. Since the relation between the signal strength and circuit constant is not verified, the circuit operation is not ensured for the practical device in the logic simulation. Since a large amount of information is applied to the circuit connection data, a large amount of data must be stored.

SUMMARY OF THE INVENTION

The present invention is intended for a logic simulator for verifying a circuit operation of a logic circuit including MOS transistors. According to the present invention, the logic simulator comprises: circuit connection data providing means for providing a circuit connection data specifying circuit connections in the logic circuit; input pattern signal providing means for applying an input pattern signal to an input portion of the logic circuit; event generating means for generating a signal value change (an event) at input and output portions of elements of the logic circuit in the circuit connection data as a function of the input pattern signal to output a circuit connection data with event generation; MOS transistor input signal extracting means for extracting an MOS transistor having input and control terminals at which the event is generated as a function of the circuit connection data with event generation to output the MOS transistor as an event generation MOS transistor (an event generation MOST); MOS transistor output signal strength determining means for detecting the event generation MOST which is turned on as a function of a conductivity type of the event generation MOST and a control signal value given from the control terminal to determine an output signal strength which is a drive capability of an output signal given from an output terminal when the event generation MOST is turned on as a function of an input signal value; and wiring signal value determining means for detecting an MOST output wiring connected to the output terminal of the event generation MOST and comparing a signal strength of the output signal determined on the output signal strength with a signal strength of another signal to be applied to the MOST output wiring where the MOST output wiring is in a signal competing condition to determine a signal value of the MOST output wiring.

In the logic simulator, the MOS transistor output signal strength determining means determines the output signal strength when the event generation MOST is turned on as a function of the input signal value, so that the ON-resistance dynamically varying with the input signal value is reflected for the determination of the output signal strength. Therefore, the logic simulation is achieved in which the signal transmitting characteristics on the input signal values of the MOS transistors are taken into consideration.

In another aspect of the present invention, the logic simulator comprises: circuit connection data providing means for providing a circuit connection data specifying circuit connections in the logic circuit; input pattern signal providing means for applying an input pattern signal to an input portion of the logic circuit; event generating means for generating a signal value change (an event) at input and output portions of elements of the logic circuit in the circuit connection data as a function of the input pattern signal to output a circuit connection data with event generation; MOS transistor input signal extracting means for extracting an MOS transistor having input and control terminals at which the event is generated as a function of the circuit connection data with event generation to output the MOS transistor as an event generation MOS transistor (an event generation MOST); and MOS transistor output signal level determining means for detecting the event generation MOST which is turned on as a function of a conductivity type of the event generation MOST and a control signal value given from the control terminal to determine an output signal level given from an output terminal when the event generation MOST is turned on as a function of an input signal value, the MOS transistor output signal level determining means verifying the presence of the danger that a through current is generated in the event generation MOST as a function of the conductivity type and a signal level of the control signal value of the event generation MOST.

In the logic simulator, since the MOS transistor output signal level determining means determines the output signal level given from the output terminal when the event generation MOST is turned on as a function of the input signal value, one of the output signals of a plurality of types which have the same logical value and different signal levels (voltage levels). When the one output signal among the plurality of types of output signals functions as the control signal of the event generation MOST, the presence/absence of the danger that the through current is generated in the event generation MOST is verified during the logic simulation as a function of the control signal level.

In still another aspect of the present invention, the logic simulator comprises: circuit connection data providing means for providing a circuit connection data specifying circuit connections in the logic circuit; input pattern signal providing means for applying an input pattern signal to an input portion of the logic circuit; event generating means for generating a signal value change (an event) at input and output portions of elements of the logic circuit in the circuit connection data as a function of the input pattern signal to output a circuit connection data with event generation; MOS transistor input signal extracting means for extracting an MOS transistor having input and control terminals at which the event is generated as a function of the circuit connection data with event generation to output the MOS transistor as an event generation MOS transistor (an event generation MOST); MOS transistor output signal delay time determining means for detecting the event generation MOST which is turned on as a function of a conductivity type of the event generation MOST and a control signal value given from the control terminal to determine a state transition delay time of an output signal given from an output terminal from an input signal when the event generation MOST is turned on as a function of an input signal value; and simulation time control. means for controlling a signal generation timing of the output signal of the event generation MOST as a function of the state transition delay time.

In the logic simulator, since the MOS transistor output signal delay time determining means determines the state transition delay time of the output signal given from the output terminal from the input signal when the event generation MOST is turned on as a function of the input signal value, the state transition delay time of the MOS transistor can vary dynamically. Therefore, the logic simulation is achieved in which the accurate state transition delay time through the MOS transistor is taken into consideration.

The present invention, in still another aspect, is intended for a logic simulator for constructing a circuit connection data in the form of a logic circuit model equivalent to a logic circuit and performing a logic simulation as a function of an input signal trigger to be applied from the exterior of the logic circuit to verify the design of the logic circuit. According to the present invention, the logic simulator comprises: circuit constant data providing means for applying a transistor circuit constant data to elements constituting the circuit connection data; element selecting means for selecting a specified element group causing a signal value competition in the circuit connection data as elements to which a signal strength data is to be set; data extracting means for extracting the transistor circuit constant data applied to the specified elements as a reference circuit constant; $\beta$ calculating means for calculating transistor gain coefficients $\beta$ as a function of the reference circuit constant and process parameters for fabrication of the logic circuit; classifying means for determining signal strength data for respective elements of the specified element group as a function of the magnitude of the gain coefficients $\beta$; signal strength data providing means for setting the signal strength data to a circuit connection data for logic simulation; and logic simulation executing means at a plural signal strength level for applying an input signal to the circuit connection data for logic simulation to execute the logic simulation.

The logic simulator, which is adapted to automatically obtain the signal strength from the circuit constant, verifies the electrical characteristics (DC characteristics) of the circuit by means of a logic circuit simulation capable of handling an extensive circuit without a circuit simulation of the whole circuit the design of which is to be verified. The logic simulator affords the reduction in manual works required for providing the signal strength and in memory capacitance required for storing the signal intensity information.

It is a primary object of the present invention to provide a logic simulator in which signal transmitting characteristics based on the input signal of MOSTs, the danger that a through current is produced in the MOSTs, and an accurate state transition delay time of the MOSTs are taken into consideration, to verify circuit operating characteristics of a logic circuit including the MOSTs.

It is another object of the present invention to provide a logic simulator which reduces manual works required to provide signal strength information and a memory capacitance required to store the signal strength information and which ensure a circuit operation in logic simulation for a practical device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 29 and 20 are circuit diagrams of exemplary circuit connection data to be processed, respectively.

DESCRIPTION OF THE PREFERRED EMBODIMENTS

Figure 1:
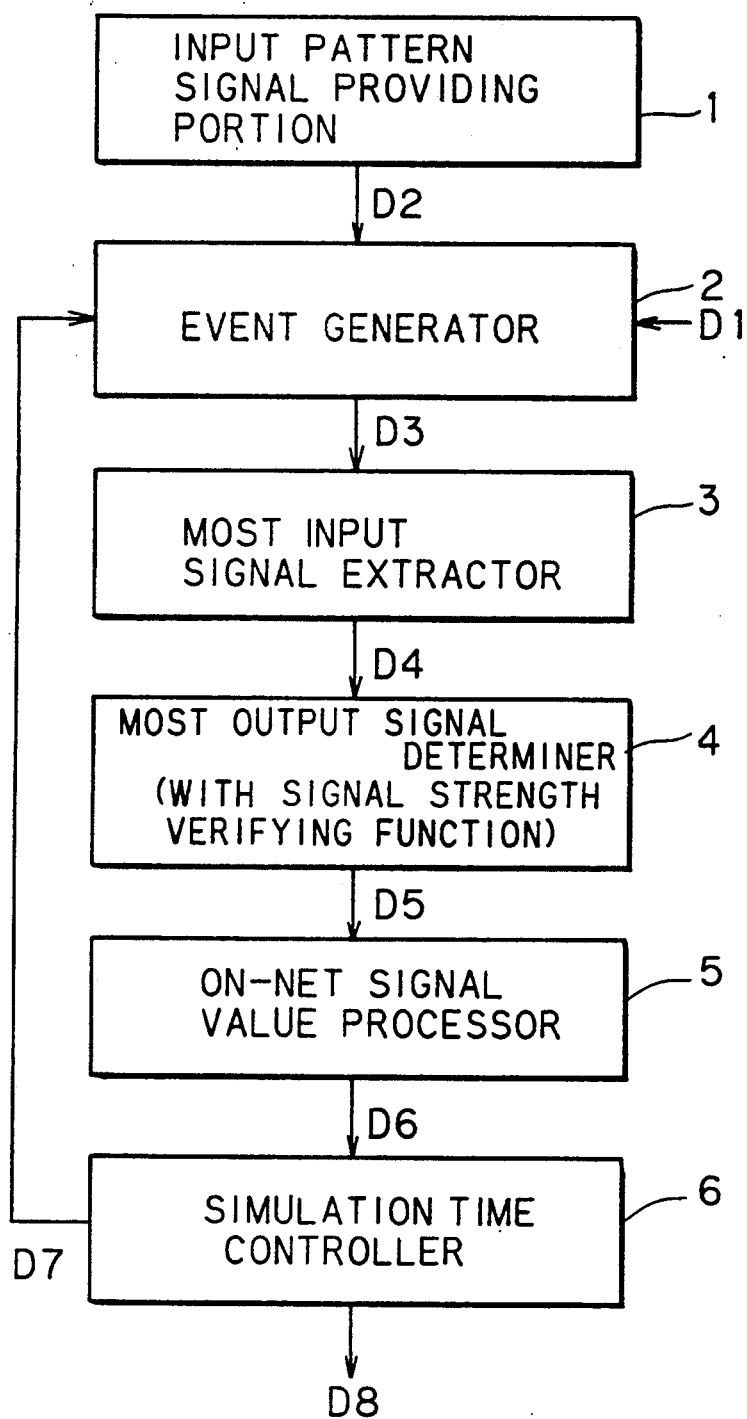
FIG. 1 is a block diagram of a logic simulator according to a first preferred embodiment of the present invention.

FIG. 1 is a block diagram of a logic simulator for a logic circuit including MOS transistors according to a first preferred embodiment of the present invention.

An input pattern signal providing portion 1 outputs an input pattern signal D2 which becomes a test pattern to an event generator 2.

The event generator 2 receives, as well as the input pattern signal D2, a circuit connection data D1 specifying circuit connections in the logic circuit to be simulated from a circuit connection data providing portion not shown. The event generator 2 also receives a circuit connection data D7 with simulation time outputted from a simulation time controller 6 during the simulation. The event generator 2 generates a signal value change (or an event) in the logic circuit as a function of the circuit connection data D1, D7 and input pattern signal D2 to output a circuit connection data D3 with event information to an MOST input signal extractor 3.

The MOST input signal extractor 3 extracts an MOS transistor having an input terminal (drain of source) connected to a wiring (or a net) in which the event is generated from the circuit connection data D3 while recognizing the conductivity type thereof. The MOST input signal extractor 3 also extracts signal values applied to the input and gate terminals of the MOS transistor, to output a circuit connection data D4 with MOS input information to an MOST output signal determiner 4.

The MOST output signal determiner 4 (with output signal strength verifying function) determines an output signal value which appears at the output terminal (drain or source) of the MOS transistor as a function of the circuit connection data D4, with the signal strength taken into consideration, to output a circuit connection data D5 with MOS output information to an on-net signal value processor 5.

The on-net signal value processor 5 determines the signal values of a net which is in a signal competing condition from the circuit connection data D5, to output a net-processed circuit connection data D6 to the simulation time controller 6.

The simulation time controller 6 carries out a simulation time control processing as a function of the net-processed circuit connection data D6. When it is necessary to continue the simulation, the simulation time controller 6 resets the simulation time in the net-processed circuit connection data D6, to output the circuit connection data D7 with simulation time to the event generator 2. When the simulation is regarded as completed, the simulation time controller 6 outputs the net-processed circuit connection data D6 given from the on-net signal value processor 5 intactly as a circuit connection data D8 with whole event generation information to a simulation result output means not shown.

Description will be given hereinafter on the principle of the logic simulator of the first preferred embodiment.

Figure 6:
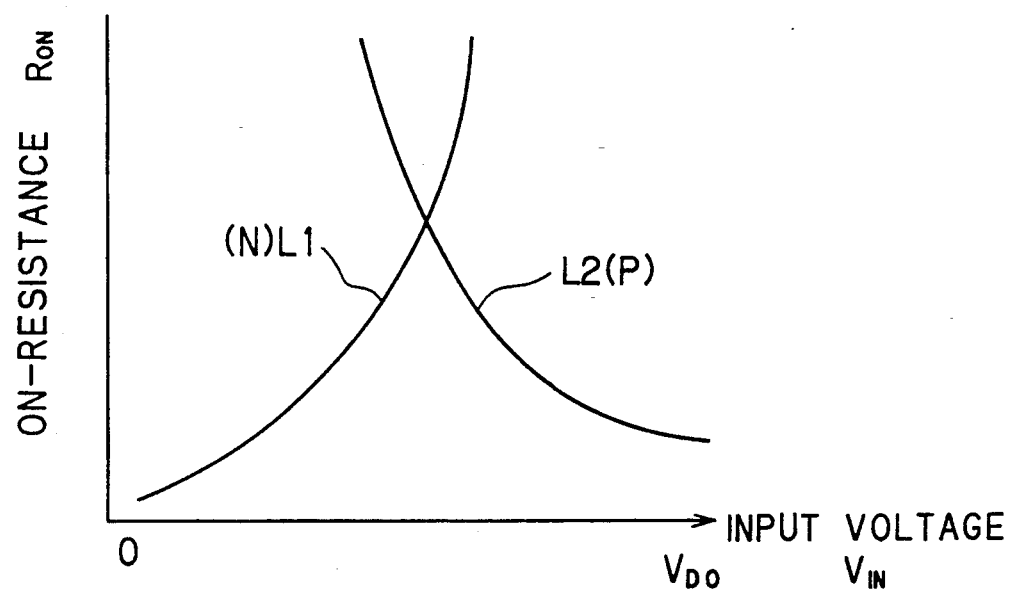
FIG. 6 is a graph showing ON-resistance characteristics of an MOS transistor.

FIG. 6 is a graph showing ON-resistance characteristics of the MOS transistor. In the graph, L1 is an ON-resistance characteristic curve of an NMOS transistor, and L2 is an ON-resistance characteristic curve of a PMOS transistor.

The ON-resistance of the NMOS transistor tends to increase as the input signal value $V_{IN}$ thereof increases (or approaches "1"). The ON-resistance of the PMOS transistor tends to increase as the input signal value $V_{IN}$ thereof decreases (or approaches "0").

Figure 7:
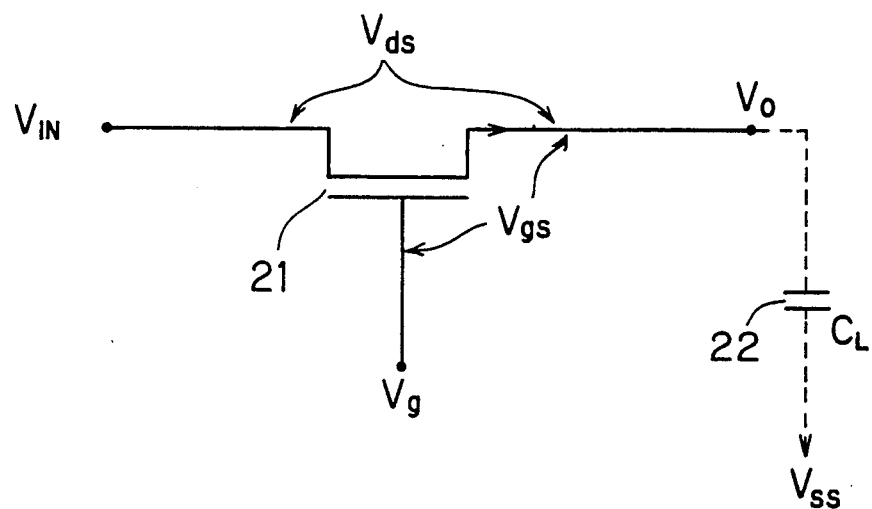
FIG. 7 is a circuit diagram of an NMOS transistor model.

FIG. 7 is a circuit diagram of an electrical characteristic model for the NMOS transistor. Reference numeral 21 designates the NMOS transistor. The drain terminal of the NMOS transistor 21 receives an input voltage $V_{IN}$ and the source terminal thereof outputs an output voltage $V_O$. Reference character $V_{ds}$ designates a drain-source voltage, $V_{gs}$ designates a gate-source voltage, and reference numeral 22 designates a load capacity of a capacitance $C_L$.

Referring to FIG. 7, the load capacity 22 is initially discharged (i.e., $V_O=0$ V). When $V_g=0$ V (or $V_{gs}=0$ V), a drain-source current $I_{ds}$ is zero, so that the output voltage $V_O$ is 0 V independently of the input voltage $V_{IN}$.

When $V_g=V_{DD}$ (power supply voltage) and $V_{IN}=V_{DD}$, the NMOS transistor 21 is on, and the load capacity 22 is charged with $V_{DD}$. At this time, a current flows across the drain and source because $V_{IN}>V_O$. A threshold voltage of the NMOS transistor 21 is designated by Vth. As the output voltage $V_O$ approaches $(V_{DD}-V_{th})$, the ON-state of the NMOS transistor 21 becomes weak, until the NMOS transistor 21 is turned off. The output voltage $V_O$, hence, increases to a maximum of $(V_{DD}-V_{th})$. This means that the signal strength of the logical value "1" falls relatively from "strong" to "weak" between the drain and source.

Figure 8:
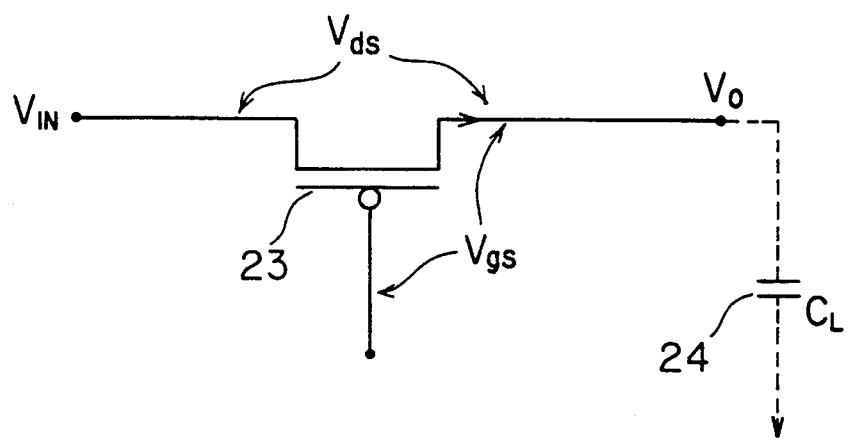
FIG. 8 is a circuit diagram of a PMOS transistor model.

FIG. 8 is a circuit diagram of an electrical characteristic model for the PMOS transistor. Reference numeral 23 designates the PMOS transistor. The source terminal of the PMOS transistor 23 receives the input voltage $V_{IN}$ and the drain terminal thereof outputs the output voltage $V_O$. Reference character $V_{ds}$ designates a drain-source voltage, $V_{gs}$ designates a gate-source voltage, and reference numeral 24 designates a load capacity of a capacitance $C_L$.

When $V_g=0$ V (at the ground level) and $V_{IN}=0$ V, the PMOS transistor 23 is on under the same principle as the NMOS transistor, and the load capacity 24 which is initially charged is discharged. A threshold voltage of the PMOS transistor 23 is designated by $V_{th}$. As the output voltage $V_O$ approaches $V_{th}$, the ON-state of the PMOS transistor 23 becomes weak, until the PMOS transistor 23 is turned off. The output voltage $V_O$, hence, decreases to a minimum of $V_{th}$. This means that the signal strength of the logical value "0" falls relatively from "strong" to "weak" between the drain and source.

It is found that, when the input signal value is "1", the ON-resistance increases and the signal strength of the output signal decreases in the NMOS transistor which is normally on and that, when the input signal value is "0", the ON-resistance increases and the signal strength of the output signal decreases in the PMOS transistor which is normally on.

FIGS. 2 to 5 are flow charts of the verification of the circuit operaing characteristics by the logic simulator of FIG. 1 according to the first preferred embodiment.

The verification of the circuit operating characteristics by the logic simulator of the first preferred embodiment will be discussed hereinafter with reference to FIGS. 2 to 5.

The circuit connection data providing means not shown applies the circuit connection data D1 to the event generator 2 in the step S1. The input pattern signal providing portion 1 applies the input pattern signal D2 which becomes the test pattern to the event generator 2 in the step S2.

In the step S3, the event generator 2 generates the signal value change (or the event) as a function of the input pattern signal D2 on the nets in the logic circuit which are specified by the circuit connection data D1, to output the circuit connection data D3 with event information to the MOST input signal extractor 3.

In the step S4, the MOST input signal extractor 3 extracts the MOS transistor having the input terminal connected to the net in which the event is generated from the circuit connection data D3 while recognizing the conductivity type thereof. The MOST input signal extractor 3 also extracts the signal values applied to the input and gate terminals of the MOS transistor, to output the circuit connection data D4 with MOS input information to the MOST output signal determiner 4.

In the step S5, the MOST output signal determiner 4 determines the output signal value which appears at the output terminal of the MOS transistor as a function of the circuit connection data D4 in consideration for the signal strength, to output the circuit connection data D5 with MOS output information to the on-net signal value processor 5. The output signal value determination in the step S5 will be described below with reference to FIG. 3.

The MOS (conductivity) type of the MOS transistor having the input terminal at which the event is generated (hereinafter referred to as an "event generation MOST") is identified in the step S11. The process proceeds to the step S12 when the MOS type is P, and the process proceeds to the step S13 when the MOS type is N.

A gate signal value of the P type event generation MOST is judged in the step S12. The process proceeds to the step S14 when the gate signal value is at high impedance (Z) or indefinite (X). The process proceeds to the step S15 when the gate signal value is "1" (at H level), and proceeds to the step S17 when it is "0" (at L level). At the same time, a gate signal value of the N type event generation MOST is judged in the step 813. The process proceeds to the step S16 when the gate signal value is at high impedance (Z) or indefinite (X). The process proceeds to the step S15 when the gate signal value is "0", and proceeds to the step S18 when it is "1".

In the steps S14 and S16, the ON/OFF state of the event generation MOST is regarded as indefinite, so that an indefinite signal X is outputted. In the step S15, the event generation MOST is regarded as OFF, so that a high-impedance signal Z is outputted.

When the gate signal value is "0" in the P type event generation MOST, the input signal value is detected to verify the ON-resistance of the event generation MOST in the step S17.

When the input signal value is "0", the signal value "0" with the signal strength which is one level lower than the signal strength of the input signal is outputted in the step S19.

The signal strengths in the first preferred embodiment are of two types: s (strong) and w (weak). The signal strength is s (strong) in the initial state. The signal strength w (weak) is one level lower than the signal strength s (strong). No signal strength is lower than w (weak). The signal values with signal strengths such as "0s" ("0" with the signal strength of "strong") and "0w" ("0" with the signal strength of "weak") are used hereinafter.

The output signal value of the P type event generation MOST is set to "0w" in the step S19, whether the input signal value thereof is "0s" or "0w".

When the input signal value is "1" in the step S17, the signal value "1" is outputted without changing the signal strength of the input signal in the step S20. That is, the output signal value of the P type event generation MOST is set to "1s" ("1" with the signal strength of "strong") when the input signal value thereof is "1s", end the output signal value thereof is set to "1w" ("1" with the signal strength of "weak") when the input signal value thereof is "1w".

On the other hand, when the gate signal value is "1" in the N type event generation MOST, the input signal value is detected to verify the ON-resistance of the event generation MOST in the step S18.

When the input signal value is "1", the signal value "1" with the signal strength which is one level lower than the signal strength of the input signal is outputted in the step S21, similarly to the step S19.

That is, the output signal value of the N type event generation MOST is set to "1w" in the step S21, whether the input signal value thereof is "1s" or "1w".

When the input signal value is "0" in the step S18, the signal value "0" is outputted without changing the signal strength of the input signal in the step S20. That is, the output signal value of the N type event generation MOST is set to "0s" when the input signal value thereof is "0s", and the output signal value thereof is set to "0w" when the input signal value thereof is "0w".

Figure 2:
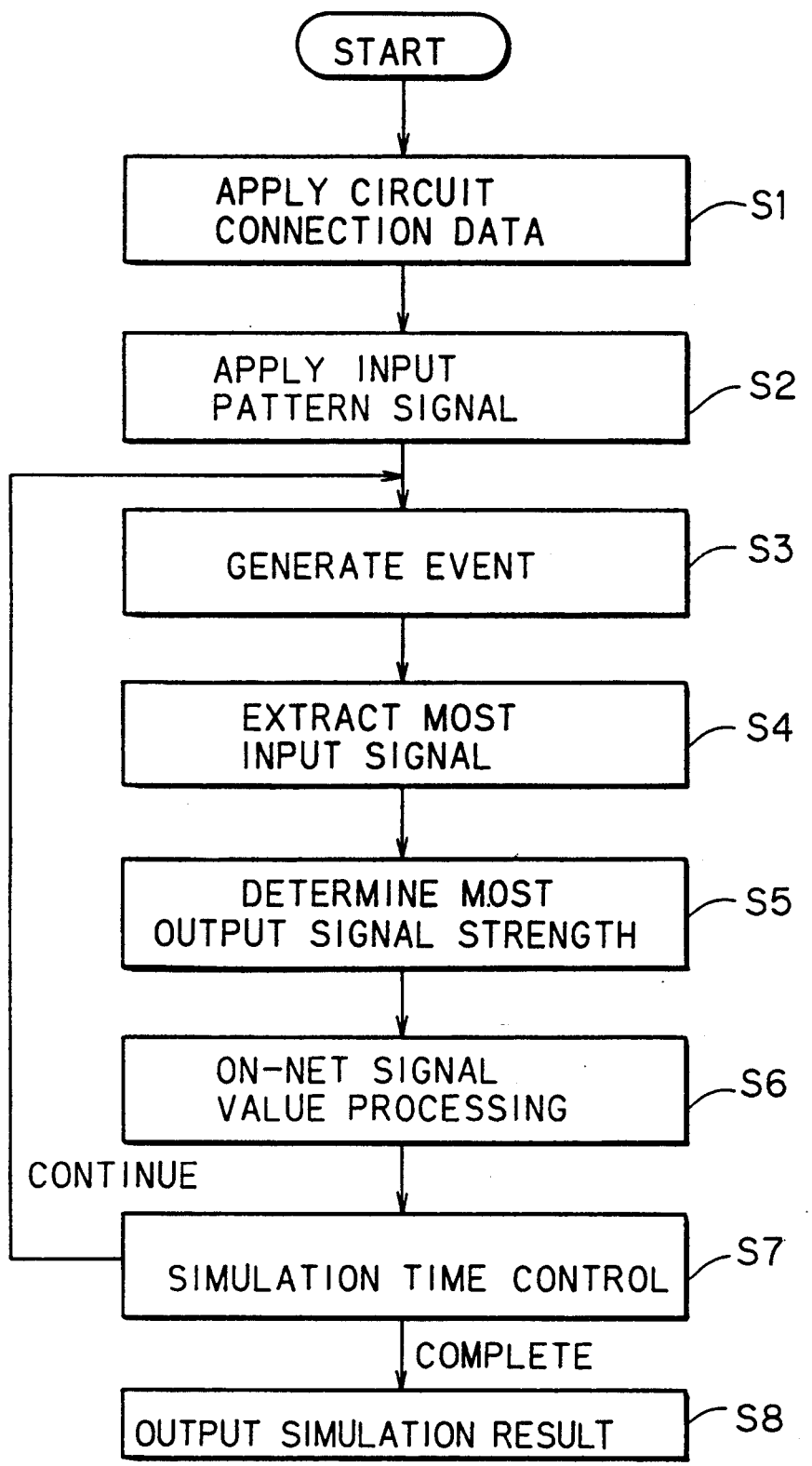
FIGS. 2 to 5 are flow charts of the operation of the logic simulator of the first preferred embodiment.
Figure 3:
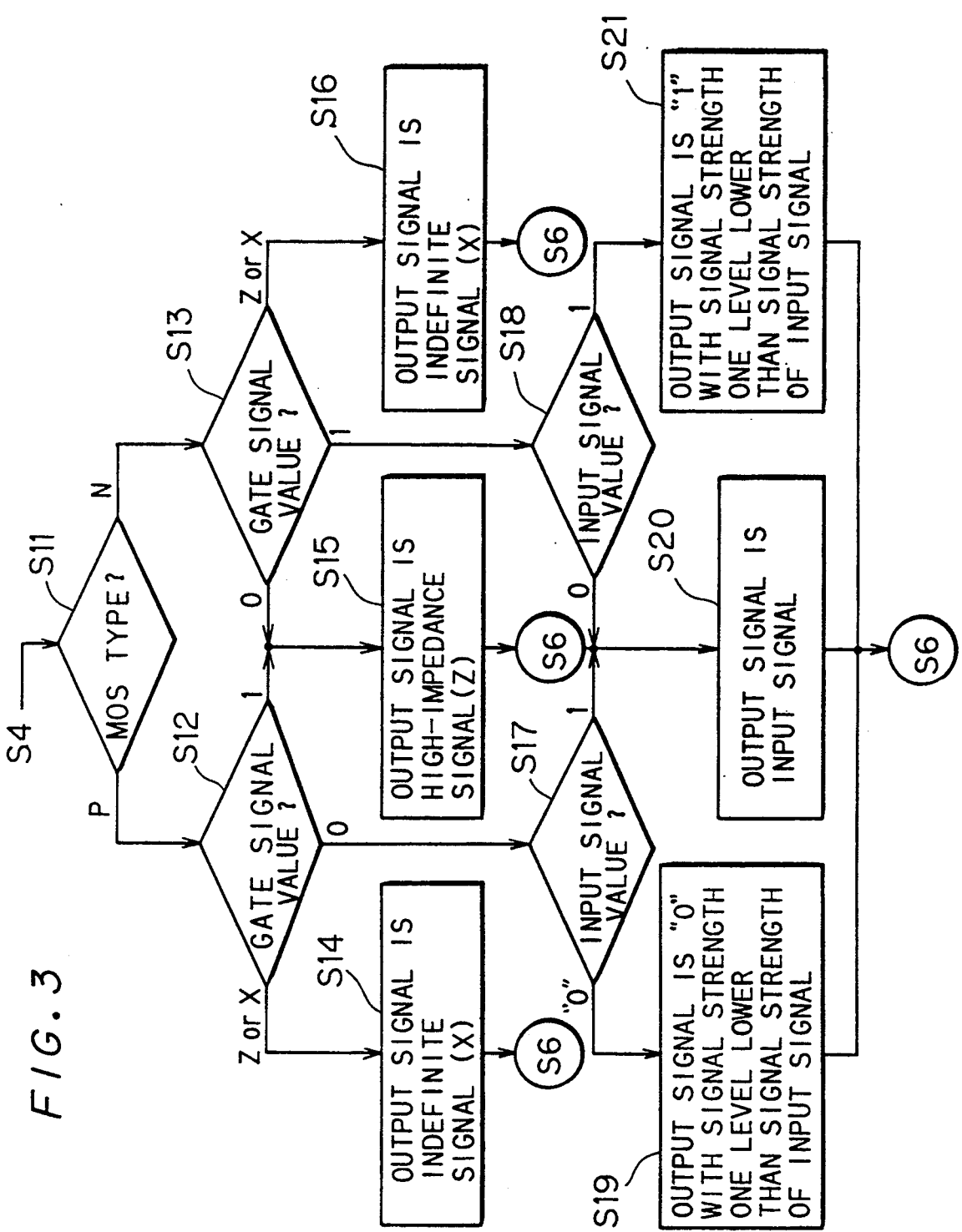
Figure 4:
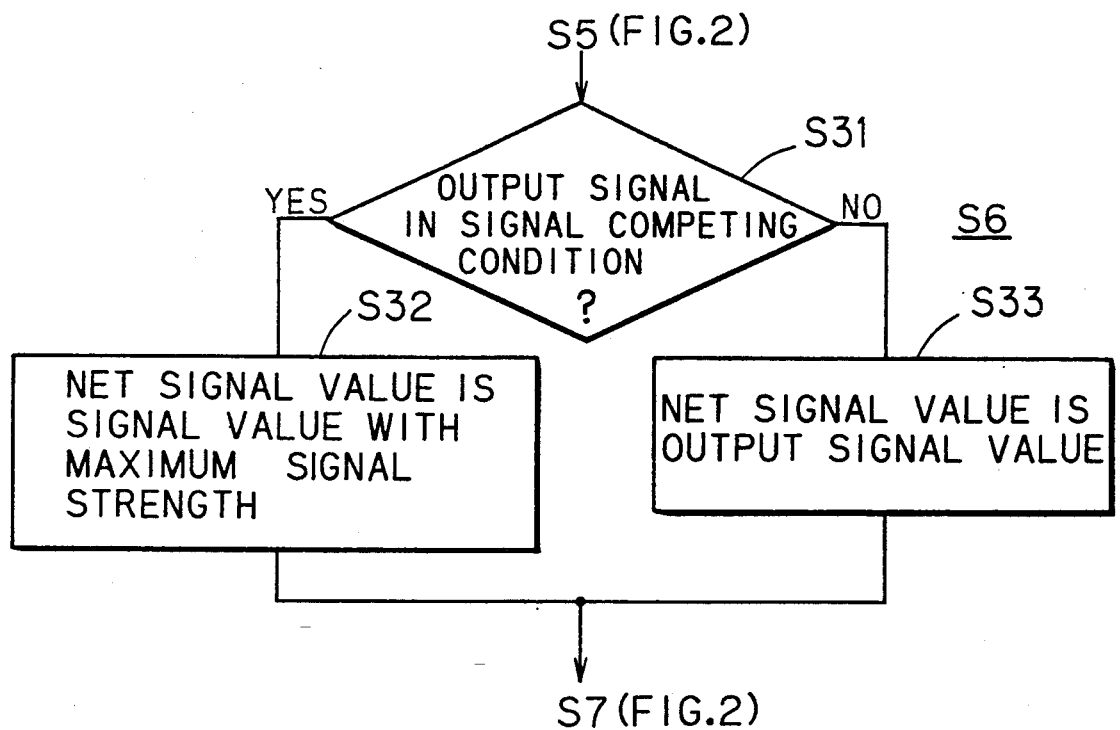
Figure 5:
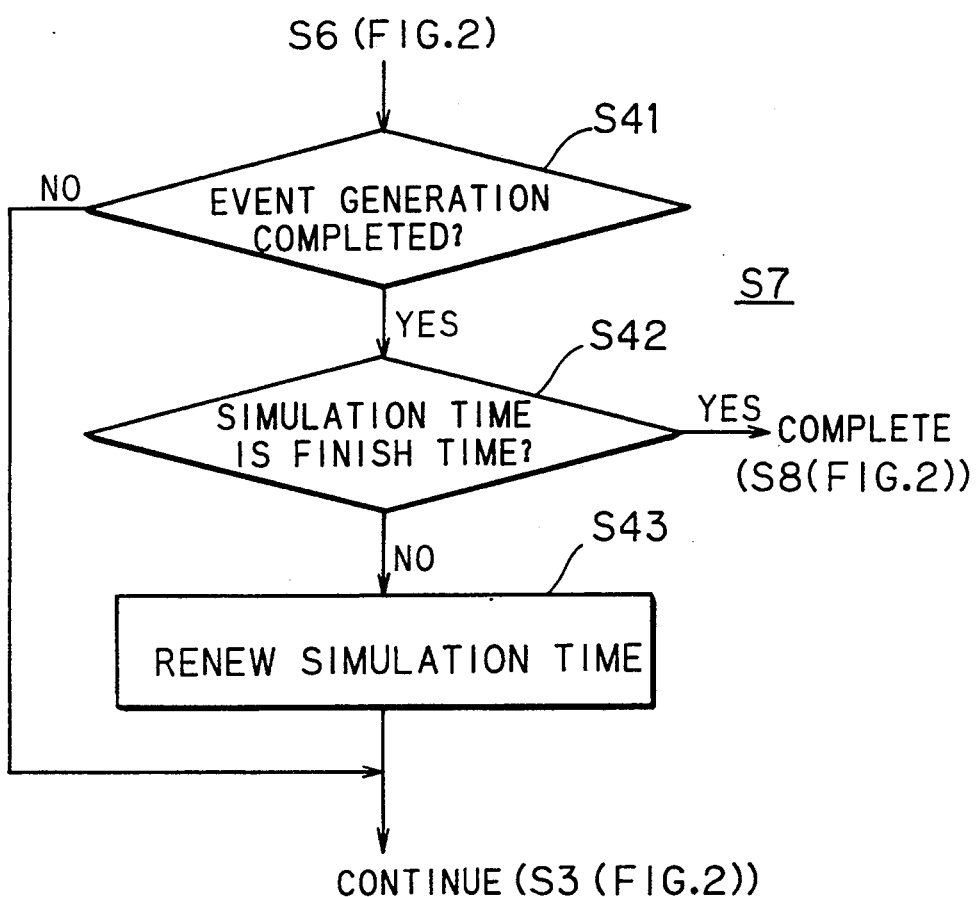

The output signal value with the signal strength for the event generation MOST is determined in one of the steps S14 to S16 and S19 to S21, and then the process proceeds to the step S6 of FIG. 2.

In the step S6 of FIG. 2, the on-net signal value processor 5 determines the signal values of the net which is in the signal competing condition from the circuit connection data D5 with MOS output information, to output the net-processed circuit connection data D6 to the simulation time controller 6. The net processing in the step S6 will be described below with reference to FIG. 4.

It is detected in the step S31 whether or not the net to which the output signal of the event generation MOST is applied is in the signal competing condition. The process proceeds to the step S32 when it is in the signal competing condition, and the process proceeds to the step S33 when it is not.

In the step S32, the value of a signal having the maximum signal strength among a plurality of signals which compete with each other is determined as a net signal value. The process then proceeds to the step S7 of FIG. 2. The signal strength discussed herein contains a drive capability of the transistors as a function of the transistor size and the signal strength (s (strong) and w (weak)) appended in the step S5 of FIG. 2.

The signal strength order of the output signals of the MOS transistors having the same transistor size, for example, is determined as:

$$1s = 0s = Xs > 1w = 0w = Xw > Z$$

When it is judged in the step S31 that the net is not in the signal competing condition, the output signal of the event generation MOST is determined intactly as the net signal value, and the process proceeds to the step S7 of FIG. 2.

In the step S7 of FIG. 2, the simulation time controller 6 carries out the simulation time control processing as a function of the net-processed circuit connection data D6. When it is necessary to continue the simulation, the simulation time controller 6 resets the simulation time to output the circuit connection data D7 with simulation time to the event generator 2, whereby the continuation of the simulation is instructed. When it is judged that the simulation is completed, the simulation time controller 6 outputs the net-processed circuit connection data D6 in the form of the circuit connection data D8 with whole event generation information to the simulation result output means not shown, and the process proceeds to the step S8 of FIG. 2. The simulation time control processing in the step S7 will be described below with reference to FIG. 5.

It is checked in the step S41 whether or not the event generation is completed at the current simulation time. When it is judged that the event generation is not completed, the process proceeds to the step S3 of FIG. 2 to continue the simulation without changing the simulation time.

When it is judged in the step S41 that the event generation is completed, the process proceeds to the step S42. It is checked in the step S42 whether or not the simulation time is a (simulation) finish time. When it is, the process proceeds to the step S8 of FIG. 2 to complete the simulation.

When it is not, the simulation time is put forward in the step S43. The circuit connection data D7 as a function of the renewed simulation time is applied to the event generator 2. The process proceeds to the step S3 of FIG. 2 to continue the logic simulation.

When it is judged to continue the simulation in the step S7, the simulation time is reset (kept in status quo or renewed) and, subsequently, the process returns to the step S3. The event generation, extraction of the input signal of the MOST, determination of the output signal of the MOST in which the signal strength is verified, on-net signal value processing and simulation time control processing are continued as a function of the circuit connection data D7 in the steps S3 to S7, until the simulation is regarded as completed in the step S7.

When it is judged in the step S7 that the simulation is completed, the process proceeds to the step S8. In the step S8, the simulation result output means not shown outputs to the CRT not shown or the like the simulation result list including signal names, event generation time, signal values and the like as a function of the circuit connection data D8 with whole event generation information.

In the logic simulator of the first preferred embodiment, the MOS transistor changes the signal strength of the output signal of the MOS transistor as a function of the input signal value thereof in order to take into consideration the ON-resistance which is variable with the voltage of the input signal. The logic simulator of the first prefered embodiment achieves the logic simulation in consideration for the signal transmitting characteristics as a function of the input signal value of the MOST.

Figure 9:
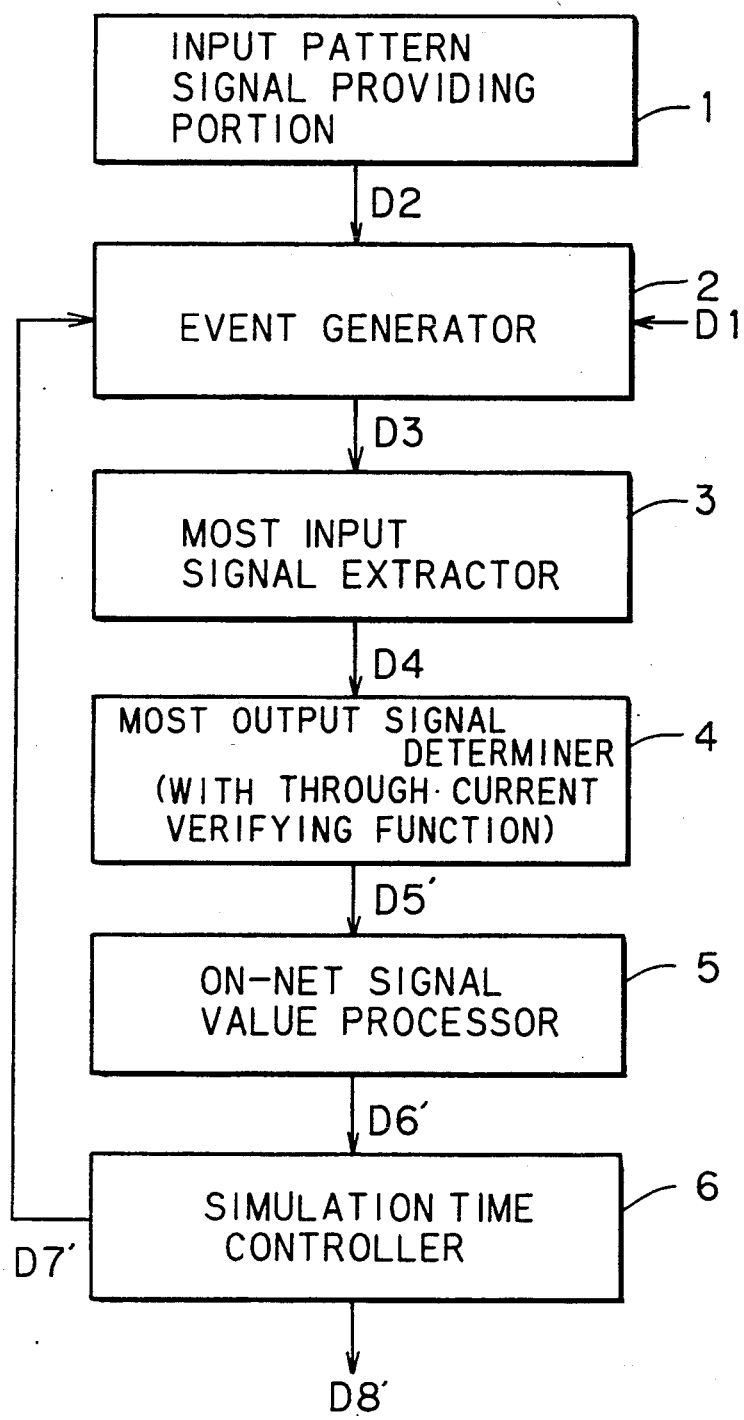
FIG. 9 is a block diagram of the logic simulator according to a second preferred embodiment of the present invention.

FIG. 9 is a block diagram of the logic simulator for the logic circuit including the MOS transistors according to a second preferred embodiment of the present invention.

The input pattern signal providing portion 1 outputs the input pattern signal D2 to the event generator 2.

The event generator 2 receives, as well as the input pattern signal D2, the circuit connection data D1 specifying circuit connections in the logic circuit from the circuit connection data providing portion not shown. The event generator 2 also receives the circuit connection data D7 with simulation time from the simulation time controller 6 during the simulation. The event generator 2 generates the signal value change (or event) in the logic circuit as a function of the circuit connection data D1, D7 and input pattern signal D2, to output the circuit connection data D3 with event information to the MOST input signal extractor 3.

The MOST input signal extractor 3 extracts the MOS transistor having the input terminal connected to the net in which the event is generated from the circuit connection data D3 while recognizing the conductivity type thereof. The MOST input signal extractor 3 also extracts the signal values applied to the input and gate terminals of the MOS transistor, to output the circuit connection data D4 with MOS input information to an MOST output signal determiner 7.

The MOST output signal determiner 7 (with through current verifying function) determines the output signal value which appears at the output terminal of the MOS transistor as a function of the circuit connection data D4, with a signal level taken into consideration, to output a circuit connection data D5' with MOS output information to the on-net signal value processor 5. It is simultaneously verified whether or not a through current (source to ground current) is produced in the MOS transistor. A through current means a current flowing from source to ground through a transistor insufficiently turned off.

The on-net signal value processor 5 determines the signal values of the net which is in the signal competing condition from the circuit connection data D5', to output a net-processed circuit connection data D6' to the simulation time controller 6.

The simulation time controller 6 carries out the simulation time control processing as a function of the net-processed circuit connection data D6'. When it is necessary to continue the simulation, the simulation time controller 6 resets the simulation time in the net-processed circuit connection data D6', to output a circuit connection data D7' with simulation time to the event generator 2. When the simulation is regarded as completed, the simulation time controller 6 outputs the net-processed circuit connection data D6' given from the on-net signal value processor 5 intactly as a circuit connection data D8' with whole event generation information to the simulation result output means not shown.

The principle of the logic simulator of the second preferred embodiment will be discussed hereinafter.

Figure 13:
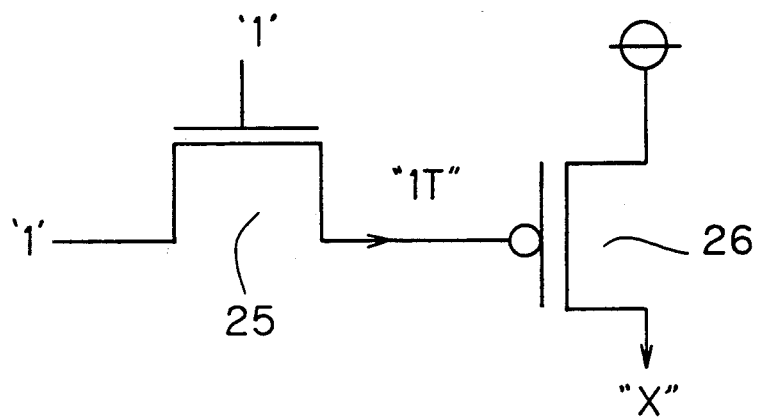
FIG. 13 is a circuit diagram for illustrating the principle of the second preferred embodiment.

FIG. 13 is a circuit diagram of an exemplary part of the logic circuit to be verified. The source of an NMOS transistor 25 is connected to the gate of a PMOS transistor 26, the source of the PMOS transistor 26 being connected to the power supply $V_{DD}$.

When the input signal value "1" is applied to the drain and gate terminals of the NMOS transistor 25 as shown in FIG. Z3, the output voltage which appears at the source terminal is lower by the threshold voltage $V_{th}$ of the NMOS transistor 25 than an input signal level. It is assumed that the output signal has the signal value "1" at a threshold level (hereinafter denoted as "1T". The gate signal value of the PMOS transistor 26 is "1T").

The gate signal value "1T" does not reach the voltage level sufficient to securely turn off the PMOS transistor 26. Since the PMOS transistor might not be turned off, it is necessary to give a warning for the danger that the through current flows.

Similarly, when the input signal value "0" is applied to the drain and gate terminals of the PMOS transistor 26, the output voltage which appears at the source terminal is higher by the threshold voltage $V_{th}$ of the PMOS transistor 26 than the input signal level, so that the output signal has the signal value "0T" at the threshold level. When the gate signal value of the NMOS transistor 25 is "0T", the NMOS transistor 25 might not be turned off. Thus it is necessary to give a warning for the danger that the through current flows.

The logic simulator of the second preferred embodiment warns the danger that the through current is generated when the threshold level signal indicative of OFF-state is applied to the gates of the MOS transistors.

Figure 10:
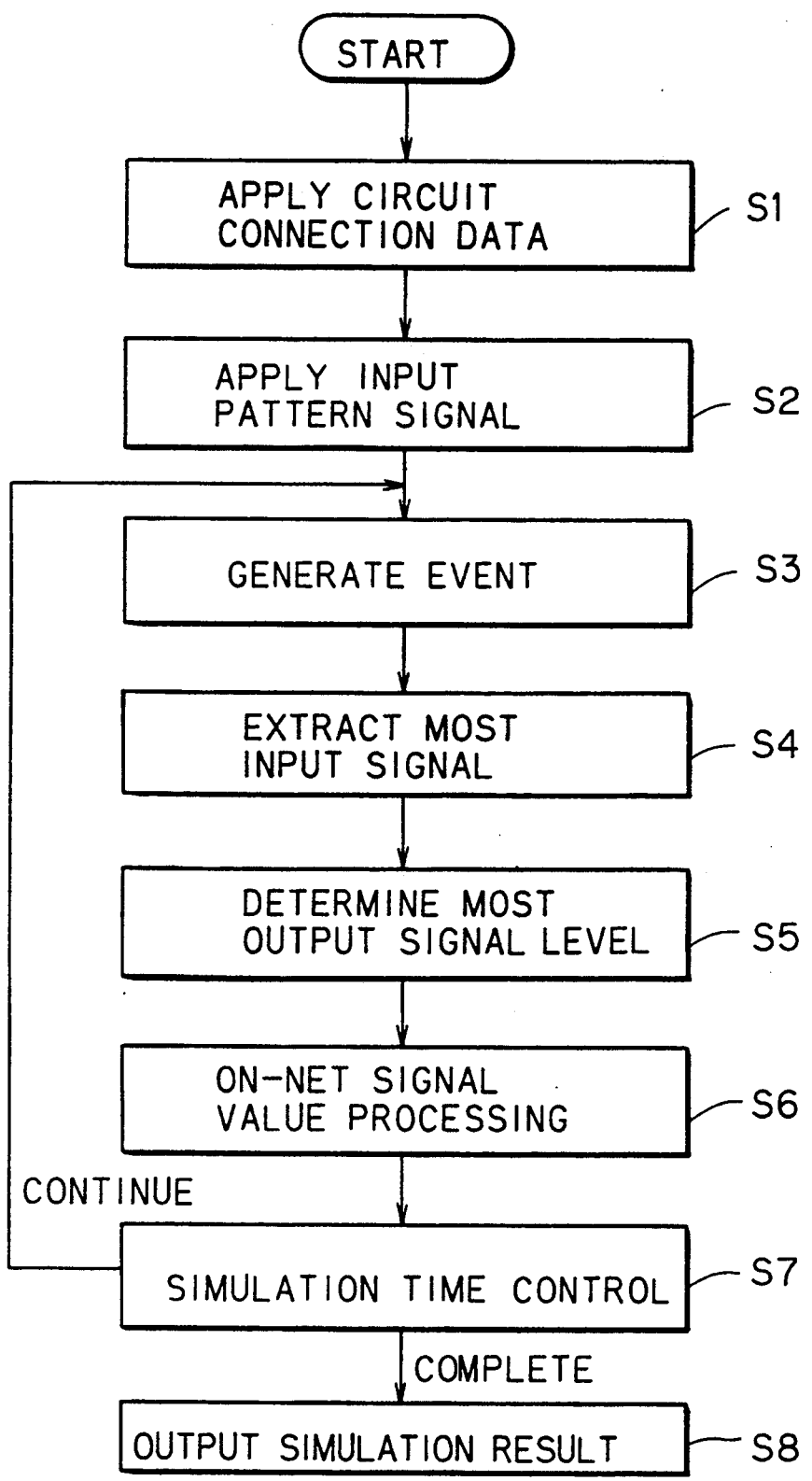
FIGS. 10 to 12 flow charts of the operation of the logic simulator of the second preferred embodiment.
Figure 11:
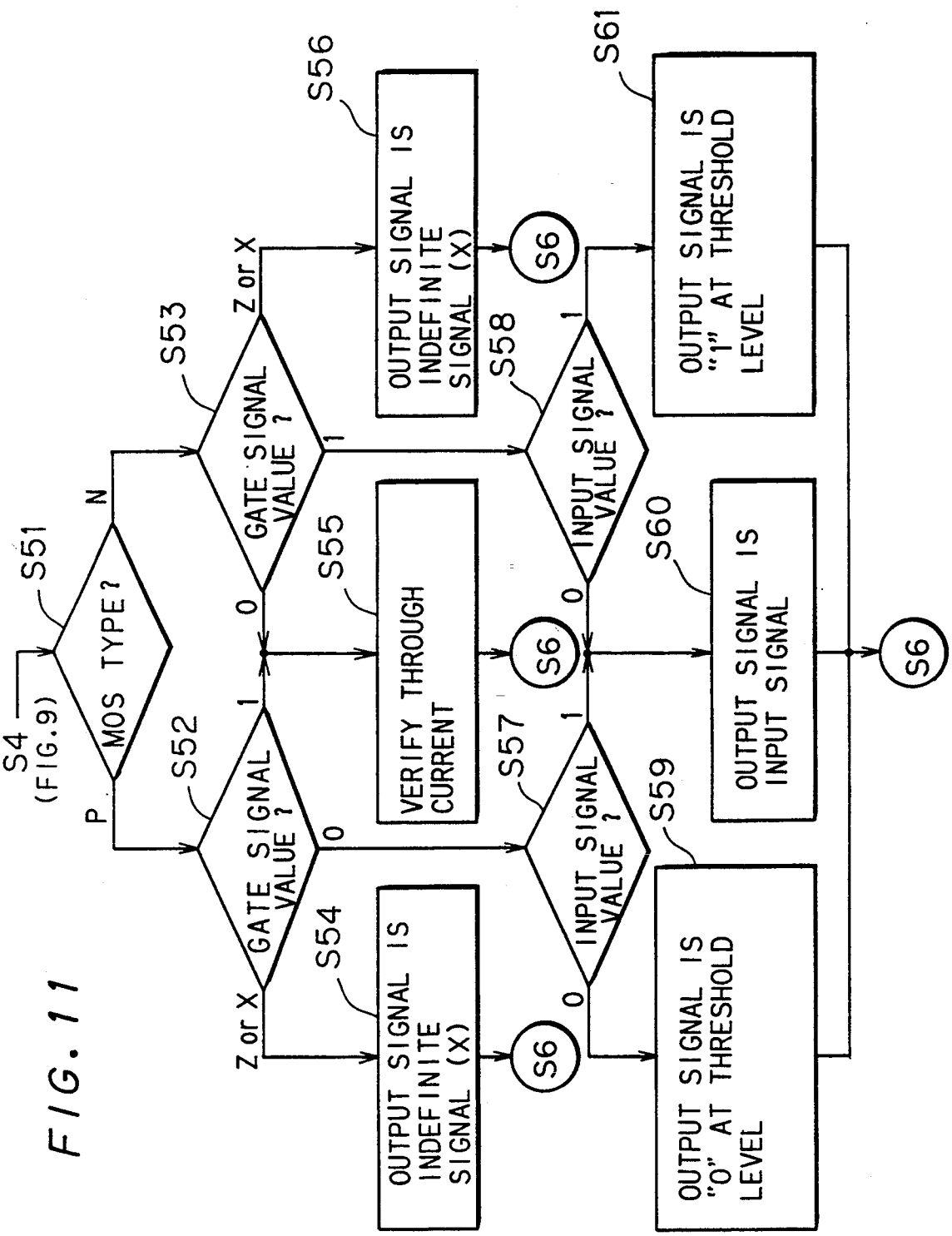
Figure 12:
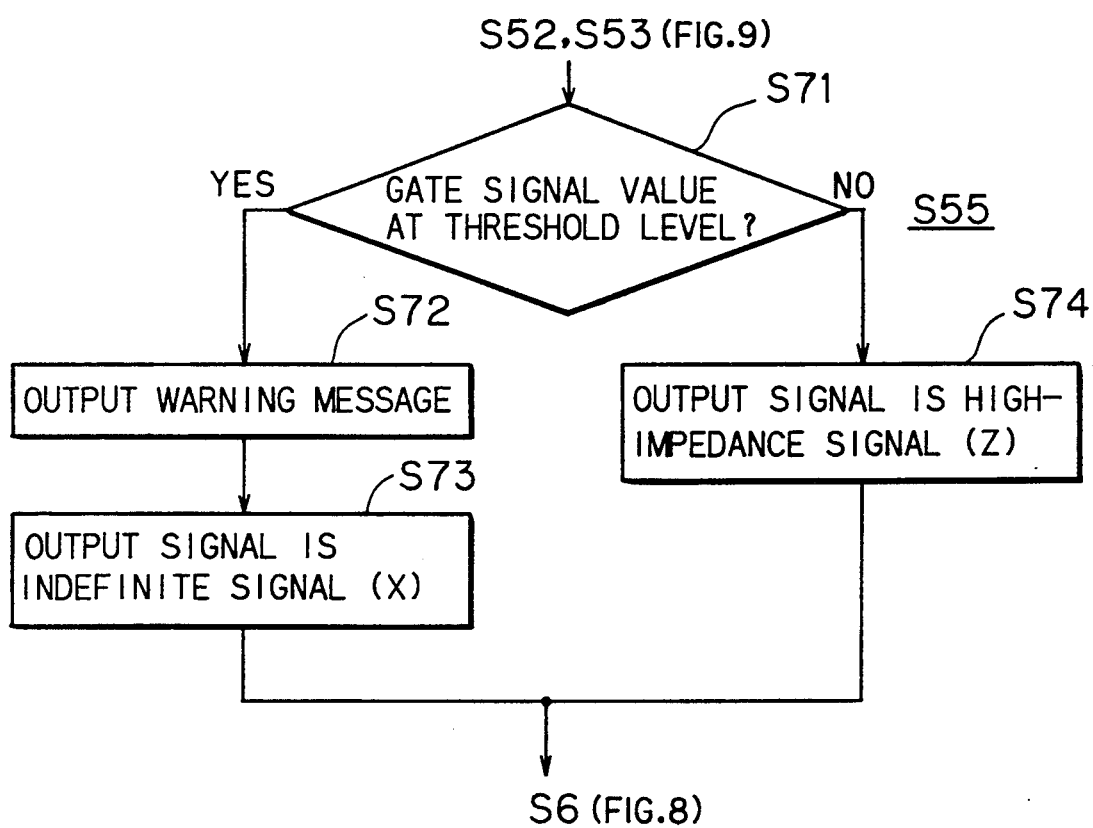

FIGS. 10 to 12 are flow charts of the verification of the circuit operating characteristics by the logic simulator of FIG. 9 according to the second preferred embodiment.

Description will be given on the verification of the circuit operating characteristics by the logic simulator of the second preferred embodiment with reference to FIGS. 10 to 12.

The circuit connection data providing means not shown applies the circuit connection data D1 to the event generator 2 in the step S1. The input pattern signal providing portion 1 applies the input pattern signal D2 which becomes the test pattern to the event generator 2 in the step S2.

In the step S3, the event generator 2 generates the signal value change (or the event) as a function of the input pattern signal D2 on the nets in the logic circuit which are specified by the circuit connection data D1, to output the circuit connection data D3 with event information to the MOST input signal extractor 3.

In the step S4, the MOST input signal extractor 3 extracts the MOS transistor having the input terminal connected to the net in which the event is generated from the circuit connection data D3 while recognizing the conductivity type thereof. The MOST input signal extractor 3 also extracts the signal values applied to the input and gate terminals of the MOS transistor, to output the circuit connection data D4 with MOS input information to the MOST output signal determiner 4.

In the step S5, the MOST output signal determiner 4 determines the output signal value which appears at the output terminal of the MOS transistor as a function of the circuit connection data D4 in consideration for the signal level, to output the circuit connection data D5' with MOS output information to the on-net signal value processor 5. The output signal value determination in the step S5 will be described below with reference to FIG. 11.

The MOS (conductivity) type of the event generation MOST having the input terminal at which the event is generated is identified in the step S51. The process proceeds to the step S52 when the MOS type is P, and the process proceeds to the step S53 when the MOS type is N.

The gate signal value of the P type event generation MOST is judged in the step S52. The process proceeds to the step S54 when the gate signal value is at high impedance (Z) or indefinite (X). The process proceeds to the step S55 when the gate signal value is "1" (at the H level), and proceeds to the step S57 when it is "0" (at the L level). At the same time, the gate signal value of the N type event generation MOST is judged in the step S53. The process proceeds to the step S56 when the gate signal value is at high impedance (Z) or indefinite (X). The process proceeds to the step S55 when the gate signal value is "0", and proceeds to the step S58 when it is "1".

The ON/OFF state of the event generation MOST is regarded as indefinite in the steps S54 and S56, so that the indefinite signal X is outputted.

When the gate signal value is "0" in the P type event generation MOST, the input signal value is checked to verify the output signal level of the event generation MOST in the step S57. When the input signal value is "0", the signal value "0" at the threshold level is outputted in the step S59.

The signal levels in the second preferred embodiment are of two types: normal level and threshold level. The signal level in the initial state is the normal level. Hereinafter, the signal value "0" at the normal level is denoted as "0N", and the signal value "0" at the threshold level is denoted as "0T". The signal value "1" at the normal level is denoted as "1N", and the signal value "1" at the threshold level is denoted as "1T".

When the input signal value is "1" in the step S57, the signal value "1" is outputted without lowering the normal level to the threshold level in the step S60. That is, the output signal value of the P type event generation MOST is set to "1N" when the input signal value thereof is "1N", and the output signal value thereof is set to "1" when the input signal value thereof is "1T".

When the gate signal value of the N type event generation MOST is "1", the input signal value is checked to verify the output signal level of the event generation MOST in the step S58. When the input signal value is "1", the signal value "1T" at the threshold level is outputted in the step S61, similarly to the step S59.

When the input signal value is "0" in the step S58, the signal value "1" is outputted in the step S60 without lowering the normal level to the threshold level. That is, the output signal value of the N type event generation MOST is set to "0N" when the input signal value thereof is "0N", and the output signal value thereof is set to "0T" when the input signal value thereof is "0T".

On the other hand, when the gate signal value of the P type event generation MOST is "1" or when the gate signal value of the N type event generation MOST is "0", the OFF-state of the event generation MOST is checked in the step S55, to verify whether or not the through current is generated in the MOS transistors. The verification of the through current in the step S55 is described below with reference to FIG. 12.

It is checked in the step S71 whether or not the gate signal value is at the threshold level.

When the gate signal value is at the threshold level, the OFF-state of the event generation MOST is regarded as unstable in the step S72. After the warning is given for the danger that the through current flows, the indefinite signal X is outputted in the step S73, and the process proceeds to the step S6 of FIG. 10.

When the gate signal value is not at the threshold level (but at the normal level), the high-impedance signal Z is outputted in the step S74, and the process proceeds to the step S6 of FIG. 10.

The output signal value of the event generation MOST is determined in one of the steps S54 to S56 and S59 to S61. The process then proceeds to the step S6 of FIG. 10.

In the step S6 of FIG. 10, the on-net signal value processor 5 determines the signal values of the net which is in the signal competing condition from the circuit connection data D5' with MOS output information, to output the net-processed circuit connection data D6' to the simulation time controller 6, similarly to the first preferred embodiment.

In the step S7, the simulation time controller 6 carries out the simulation time control processing as a function of the net-processed circuit connection data D6' similarly to the first preferred embodiment. When it is necessary to continue the simulation, the simulation time controller 6 resets the simulation time to output the circuit connection data D7' with simulation time to the event generator 2, whereby the continuation of the simulation is instructed. When it is judged that the simulation is completed, the simulation time controller 6 outputs the net-processed circuit connection data D6' in the form of the circuit connection data D8' with whole event generation information to the simulation result output means not shown. The process then proceeds to the step S8.

When it is judged to continue the simulation in the step S7, the simulation time is reset (kept in status quo or renewed) and, subsequently, the process returns to the step S3. The event generation, extraction of the input signal of the MOST, determination of the output signal of the MOST with the through current verifying function, on-net signal value processing and simulation time control processing are continued as a function of the circuit connection data D7' in the steps S3 to S7, until the simulation is regarded as completed in the step S7.

When it is judged in the step S7 that the simulation is completed, the process proceeds to the step S8. In the step S8, the simulation result output means outputs to the CRT not shown or the like the simulation result list including the signal names, event generation time, signal values and the like as a function of the circuit connection data D8' with whole event generation information.

In the logic simulator of the second preferred embodiment, the output signal level of the MOS transistor is changed as a function of the input signal value thereof, and the warning is given for the danger of the through current flows when the event generation MOST is turned off with the gate signal at the threshold level. The logic simulator of the second preferred embodiment achieves the logic simulation while verifying the presence/absence of the through current in the MOST.

Figure 14:
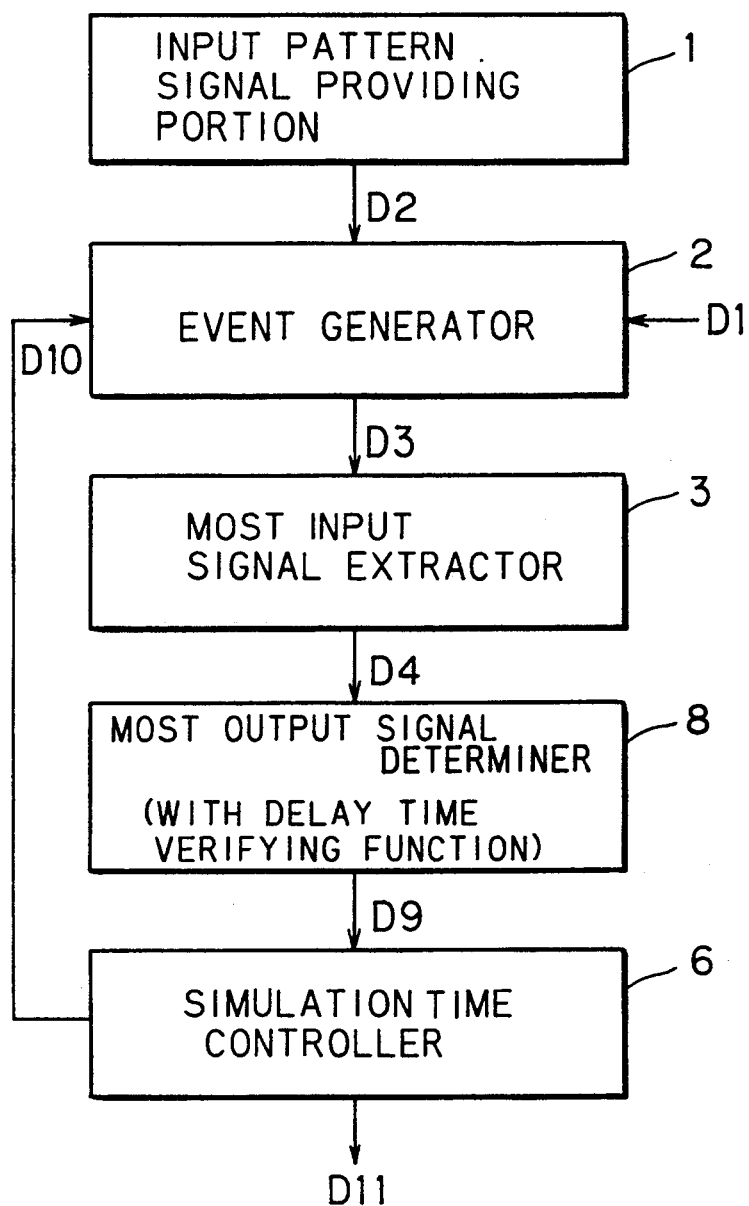
FIG. 14 is a block diagram of the logic simulator according to a third preferred embodiment of the present invention.

FIG. 14 is a block diagram of the logic simulator for the logic circuit including the MOS transistors according to a third preferred embodiment of the present invention.

The input pattern signal providing portion 1 outputs the input pattern signal D2 which becomes the test pattern to the event generator 2.

The event generator 2 receives, as well as the input pattern signal D2, the circuit connection data D1 specifying circuit connections in the logic circuit from the circuit connection data providing portion not shown. The event generator 2 also receives a circuit connection data D10 with simulation time from the simulation time controller 6 during the simulation. The event generator 2 generates the event in the logic circuit as a function of the circuit connection data D1, D10 and input pattern signal D2, to output the circuit connection data D3 with event information to the MOST input signal extractor 3.

The MOST input signal extractor 3 extracts the MOS transistor having the input terminal connected to the net in which the event is generated from the circuit connection data D3 while recognizing the conductivity type thereof. The MOST input signal extractor 3 also extracts the signal values applied to the input and gate terminals of the MOS transistor, to output the circuit connection data D4 with MOS input information to an MOST output signal determiner 8.

The MOST output signal determiner 8 determines the output signal value which appears at the output terminal of the MOS transistor as a function of the circuit connection data D4, with a state transition delay time taken into consideration, to output a circuit connection data D9 with MOS output information to the on-net signal value processor 5.

The simulation time controller 6 carries out the simulation time control processing as a function of the circuit connection data D9. When it is necessary to continue the simulation, the simulation time controller 6 resets the simulation time in the circuit connection data D9 to output the circuit connection data D10 to the event generator 2. When the simulation is regarded as completed, the simulation time controller 6 outputs the circuit connection data D9 given from the MOST output signal determiner 8 intactly as a circuit connection data D11 with whole event generation information to the simulation result output means not shown.

Figure 18:
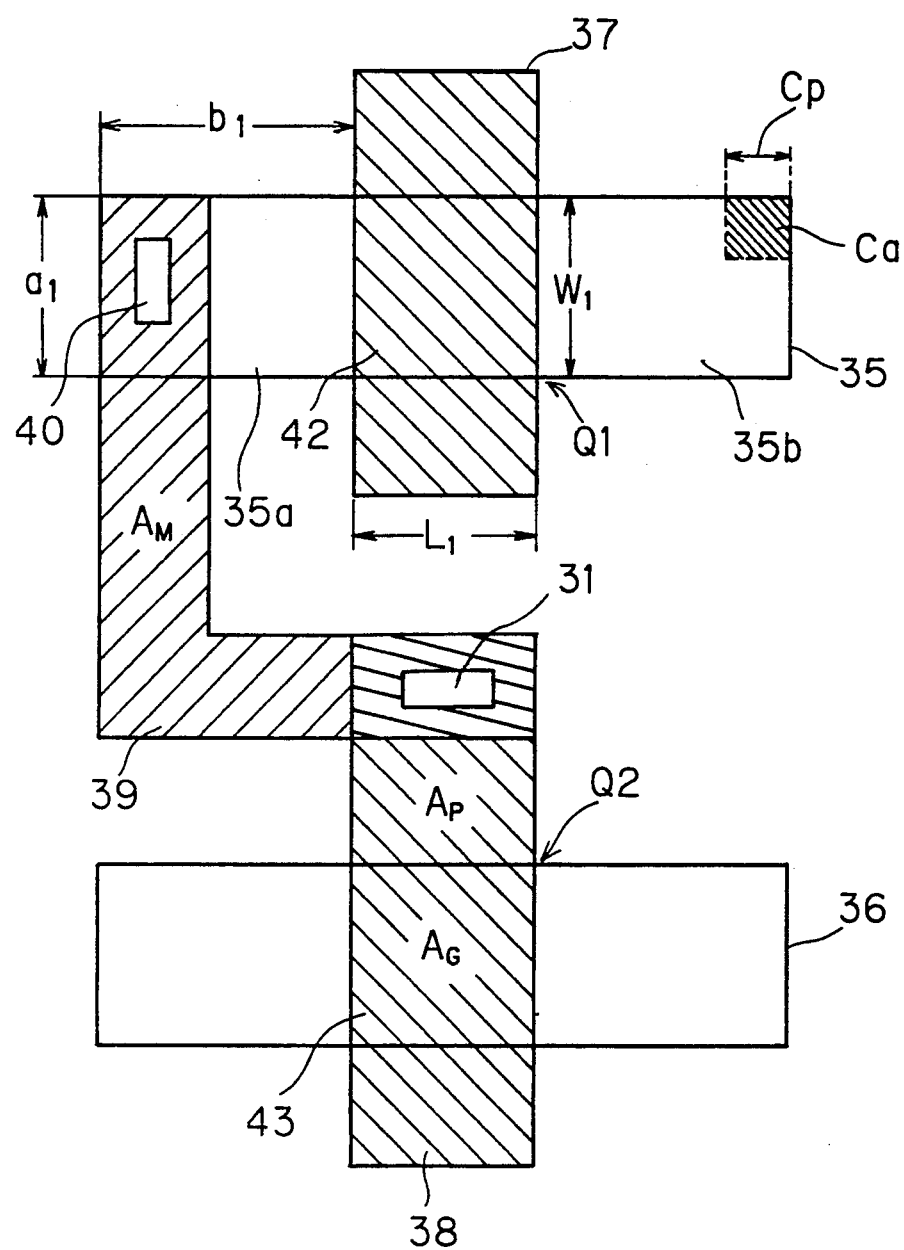
FIG. 18 illustrates the principle of the third preferred embodiment.
Figure 19:
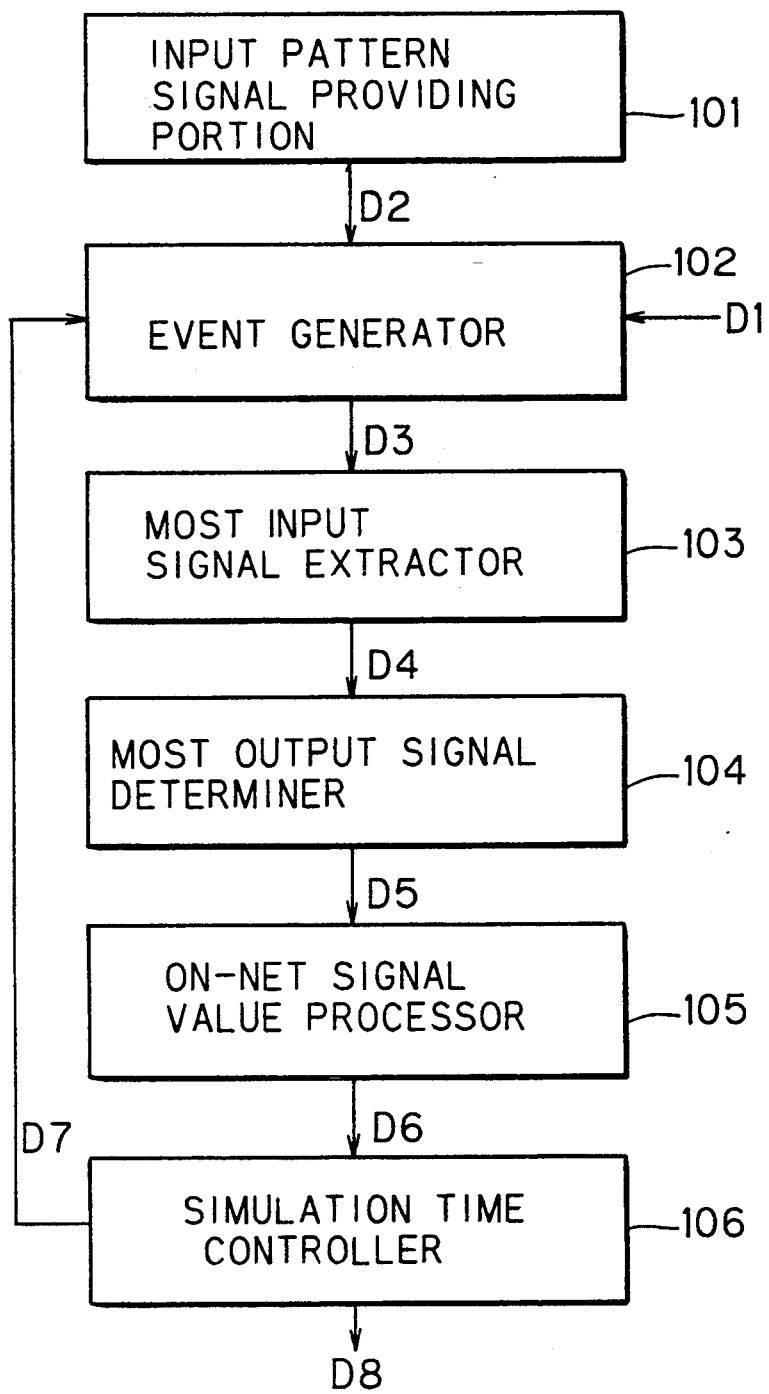
FIG. 19 is a block diagram of a conventional logic simulator.
Figure 20:
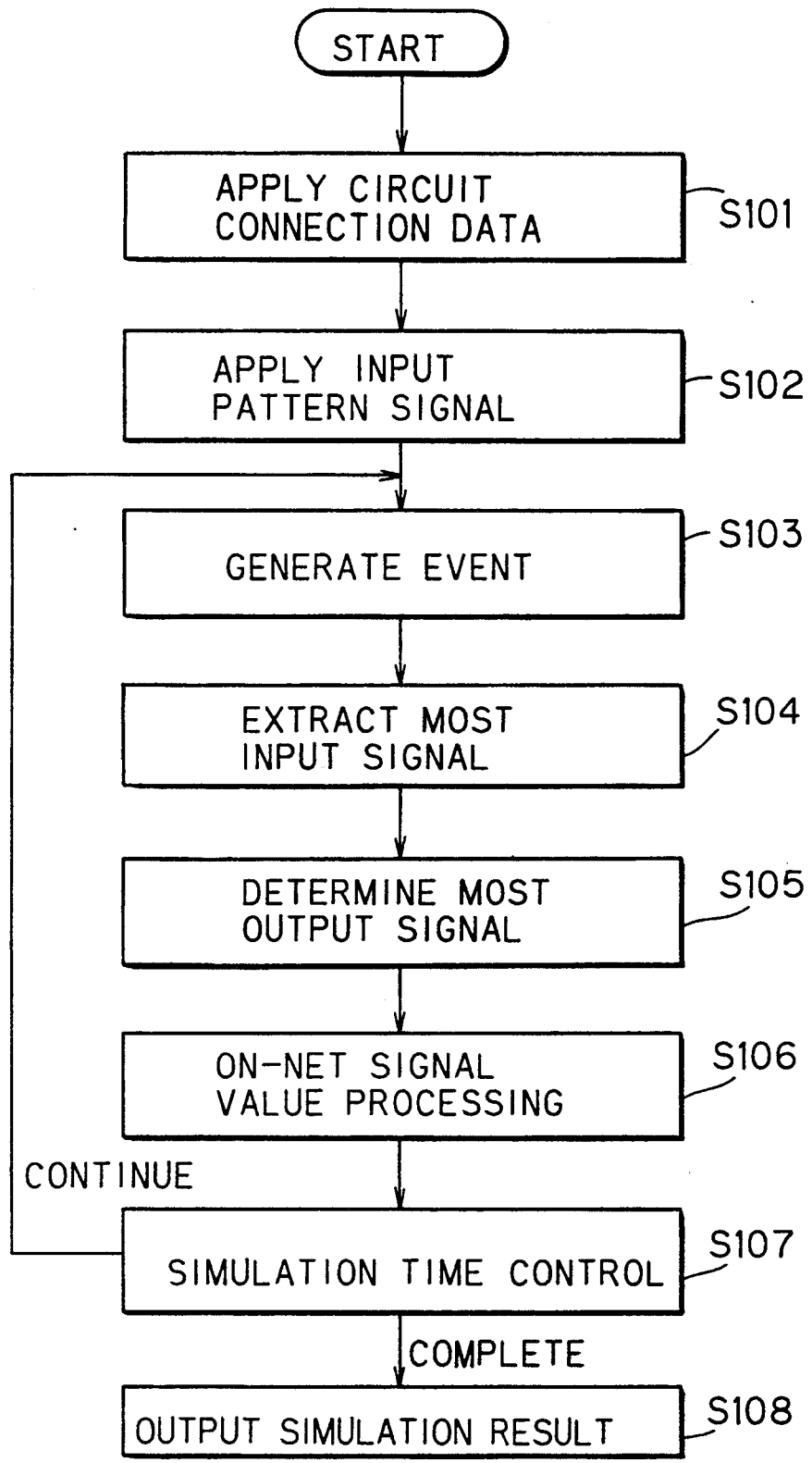
FIGS. 20 to 23 are flow charts of the operation of the conventional logic simulator.
Figure 21:
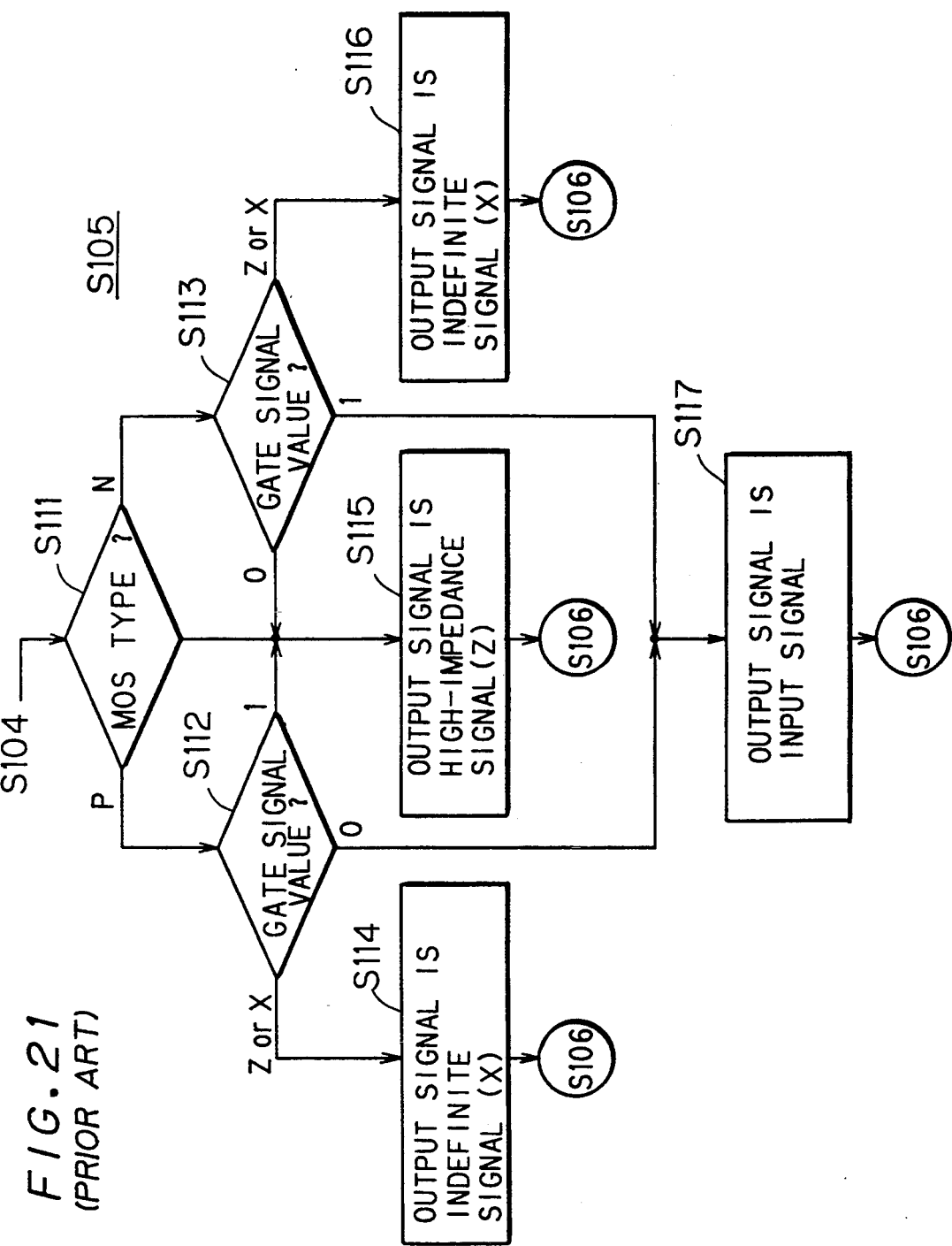
Figure 22:
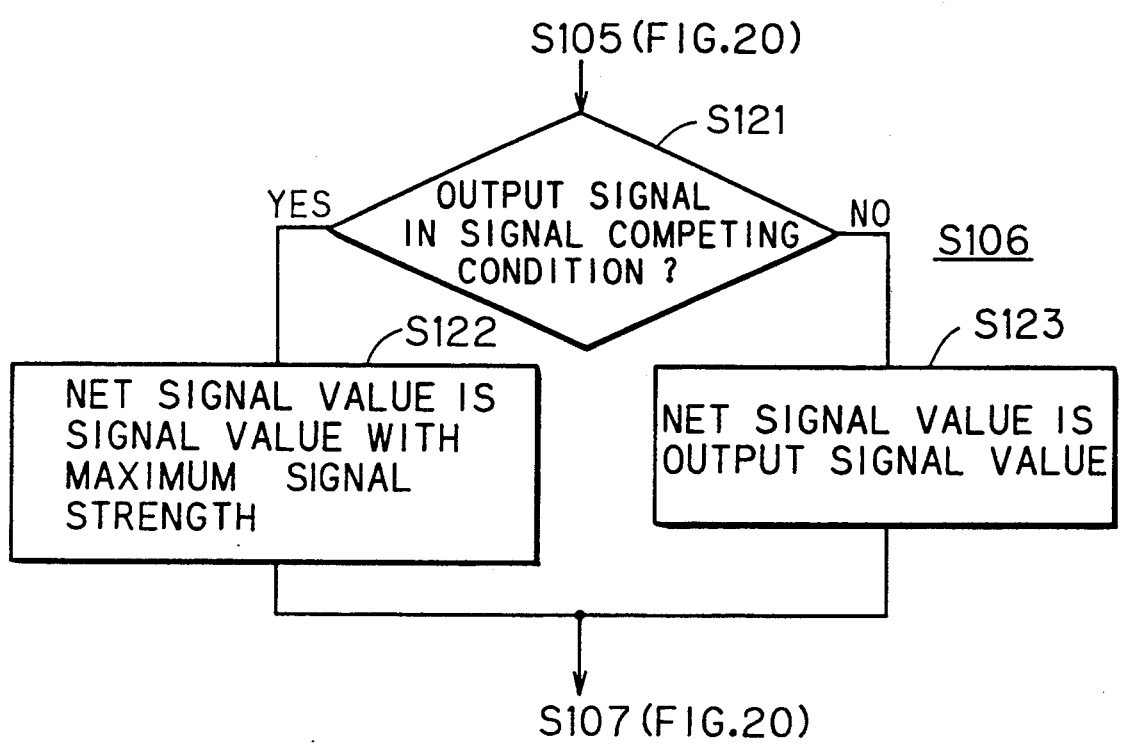
Figure 23:
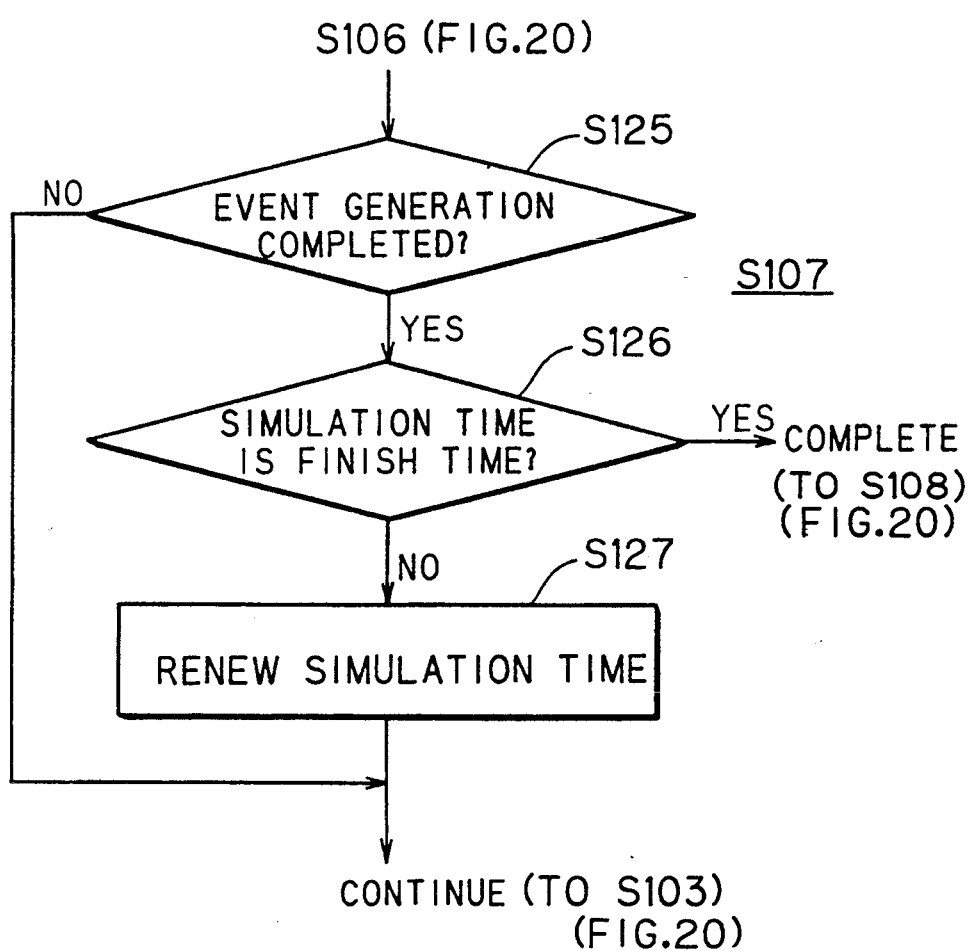

FIG. 18 illustrates exemplary layout pattern data for two transistors Q1 and Q2. Reference numerals 35 and 36 designate diffusion regions; 37 and 38 designate polysilicon regions; 39 designates an aluminium wiring region; and 40 and 31 designate contact regions. Portions 42 and 43 in which the diffusion regions 35 and 36 overlap the polysilicon regions 37 and 38 are gate formation regions for the transistors Q1 and Q2, respectively.

The principle of the logic simulator of the third preferred embodiment will be described hereinafter with reference to FIGS. 7, 8 and 18.

The calculation of a state transition delay time $t_{fn}$ when the output signal value of the NMOS transistor is "0" is described below.

In general, the source-drain current $I_{ds}$ in a saturation region of the MOS transistor is expressed by means of primary approximation as:

$$I_{ds} = \frac{\beta}{2}(V_{gs} - V_{th})^2 \qquad (1)$$

where $0 < V_{gs} - V_{th} < V_{ds}$ and where $\beta$ is a gain coefficient of the transistor and $V_{th}$ is a threshold voltage of the NMOS transistor. The gain coefficient $\beta$ is expressed as:

$$\beta = \frac{\mu \epsilon}{t_{ox}} \cdot \frac{W}{L} \qquad (2)$$

where $\epsilon$ is a dielectric constant of a gate oxide film; $t_{ox}$ is a film thickness thereof; $\mu$ is an effective surface mobility in a channel; L is a channel length of the MOS transistor (corresponding to $L_1$ of FIG. 18); and W is a channel width thereof (corresponding to $W_1$ of FIG. 18).

The electric charge Q discharged by the load capacity 22 of FIG. 7 is expressed by using the capacitance $C_L$ of the load capacity 22 and output voltage $V_0$ as:

$$Q = C_L \cdot V_O \qquad (3)$$

The actual load capacitance $C_L$, which is the sum of the capacitances incidentally caused in the signal lines connected to the output terminals of the transistors, is expressed as:

$$C_L = \frac{\epsilon_1}{t_1} \cdot A_1 + \sum_{l=1}^{k}\left(\frac{\epsilon_p}{t_p} \cdot A_p\right) + \\ \sum_{n=1}^{m}\{a_n \cdot b_n \cdot c_a + 2(a_n + b_n)c_p\} + \sum_{l=1}^{k}\left(\frac{\epsilon}{t_{ox}} \cdot A_G\right) \qquad (4)$$

where $\epsilon_1$ and $t_1$ are dielectric constant and film thickness of an insulating film formed immediately under an aluminium wiring region (corresponding to the aluminium wiring region 39 of FIG. 18); $A_1$ is a wiring area; $\epsilon_p$ and $t_p$ are dielectric constant and film thickness of an insulating film formed immediately under a polysilicon region (corresponding to the polysilicon regions 37 and 38 of FIG. 18); $A_p$ is the area of polysilicon (See FIG. 18); k is the number of gate terminals joined to the signal lines; m is the number of drain-source terminals joined to the signal lines; $a_n$ and $b_n$ are width and length of a drain region (corresponding to $a_1$ and $b_1$ of FIG. 18); $C_a$ is a junction capacitance per unit area between a drain diffusion region and a semiconductor layer immediately thereunder; $C_p$ is a peripheral capacitance per unit area therebetween; $\epsilon$ and $t_{ox}$ are the dielectric constant and film thickness of the gate oxide film; and $A_G$ (See FIG. 18) is the area of gate.

The following formula is derived from Formulas (1) and (4).

$$C_L \cdot \frac{dV_O}{dt} + \frac{\beta}{2}(V_{DD} - V_{th})^2 = 0 \tag{5}$$

where $V_O \geq V_{DD} - V_{th}$.

A falling delay value $t_{f1}$ of the saturation region is calculated by integration of Formula (5) from $V_O=0.9$ to $V_O=V_{DD}-V_{th}$.

$$t_{f1} = 2 \cdot \frac{C_L}{\beta(V_{DD} - V_{th})^2} \int_{V_{DD} - V_{th}}^{0.9V_{DD}} dV_O \tag{6}$$

$$= \frac{2C_L (V_{th} - 0.1V_{DD})}{\beta(V_{DD} - V_{th})^2}$$

In general, the source-drain current $I_{ds}$ in a linear region of the MOS transistor is expressed by means of primary approximation as:

$$I_{ds} = \beta \left[ (V_{gs} - V_{th}) V_{ds} - \frac{V_{ds}^2}{2} \right] \tag{7}$$

where $0 < V_{ds} < V_{gs} - V_{th}$.

The following formula is determined from Formulas (7) and (5).

$$C_L \frac{dV_O}{dt} + \beta \left( (V_{DD} - V_{th}) V_O - \frac{V_O^2}{2} \right) = 0 \tag{8}$$

where $V_O \leq V_{DD} - V_{th}$.

A falling delay value $t_{f2}$ of the linear region is calculated by integration of Formula (8) from $V_O=V_{DD}-V_{th}$ to $V_O=0.5V_{DD}$.

$$t_{f2} = \frac{C_L}{\beta(V_{DD} - V_{th})} \int_{0.1V_{DD}}^{V_{DD} - V_{th}} \frac{dV_O}{V_O - \frac{V_O^2}{2(V_{DD} - V_{th})}} \tag{9}$$

$$= \frac{C_L}{\beta(V_{DD} - V_{th})} \ln \frac{3V_{DD} - 4V_{th}}{V_{DD}}$$

Therefore, the signal transition delay time $t_{fn}$ to the signal value "0" of the NMOS transistor is given from Formulas (6) and (9) as:

$$t_{fn} = t_{f1} + t_{f2} = \frac{2C_L}{\beta(V_{DD} - V_{th})} \cdot \tag{10}$$

$$\left\{ \frac{V_{th} - 0.1V_{DD}}{V_{DD} - V_{th}} + \frac{1}{2} \ln \frac{3V_{DD} - 4V_{th}}{V_{DD}} \right\}$$

Assuming that $V_{th}$ is approximately equal to $0.2V_{DD}$, the signal transition delay time $t_{fn}$ to the signal value "0" of the NMOS transistor is determined by:

$$t_{fn} \simeq 1.3 \frac{C_L}{\beta_n \cdot V_{DD}} \tag{11}$$

Assuming that the absolute value $|V_{thp}|$ of a threshold voltage $V_{thp}$ of the PMOS transistor is approximately equal to $0.2V_{DD}$, a state transition delay time $t_{rp}$ to the signal value "1" of the PMOS transistor is determined on the similar principle by:

$$t_{rp} \simeq 1.3 \frac{C_L}{\beta_p \cdot V_{DD}} \tag{12}$$

The calculation of a state transition delay time $t_{rn}$ to the output signal value "1" of the NMOS transistor is described below.

The transition to the signal value "1" of the NMOS transistor is operated in the saturation region ($V_{ds} > V_{gs} - V_t$), and is varied with fluctuation of the output voltage $V_O$ as expressed by:

$$V_{gs} = V_{DD} - V_O \tag{13}$$

From Formulas (1), (3) and (13) is derived:

$$C_L \cdot \frac{dV_O}{dt} + \frac{\beta}{2}(V_{DD} - V_O - V_{th})^2 = 0 \tag{14}$$

where $V_O \geq V_{DD} - V_{th}$.

Integration of Formula (14) from $V_0 = 0.1V_{DD}$ to $V_O = 0.5V_{DD}$ derives the following formula:

$$t_r = \frac{2C_L}{\beta} \int_{0.5V_{DD}}^{0.1V_{DD}} \frac{dV_O}{(V_{DD} - V_O - V_{th})^2} \tag{15}$$

$$= \frac{2C_L}{\beta} \cdot \frac{0.4V_{DD}}{(0.9V_{DD} - V_{th})(0.5V_{DD} - V_{th})}$$

Assuming that $V_{th}$ is approximately equal to $0.2V_{DD}$, the state transition delay time $t_{rn}$ to the signal value "1" of the NMOS transistors is determined by:

$$t_{rn} \simeq 3.8 \frac{C_L}{\beta_n \cdot V_{DD}} \tag{16}$$

Assuming that the absolute value $|V_{thp}|$ of the threshold voltage $V_{thp}$ of the PMOS transistor is approximately equal to $0.2V_{DD}$, the state transition delay time $t_{fp}$ to the signal value "0" of the PMOS transistor is determined on the similar principle by:

$$t_{fp} \simeq 3.8 \frac{C_L}{\beta_p \cdot V_{DD}} \tag{17}$$

The logic simulator of the third preferred embodiment, as above described, calculates the state transition delay time as a function of differences in conductivity type and input signal value of the MOS transistors.

Figure 15:
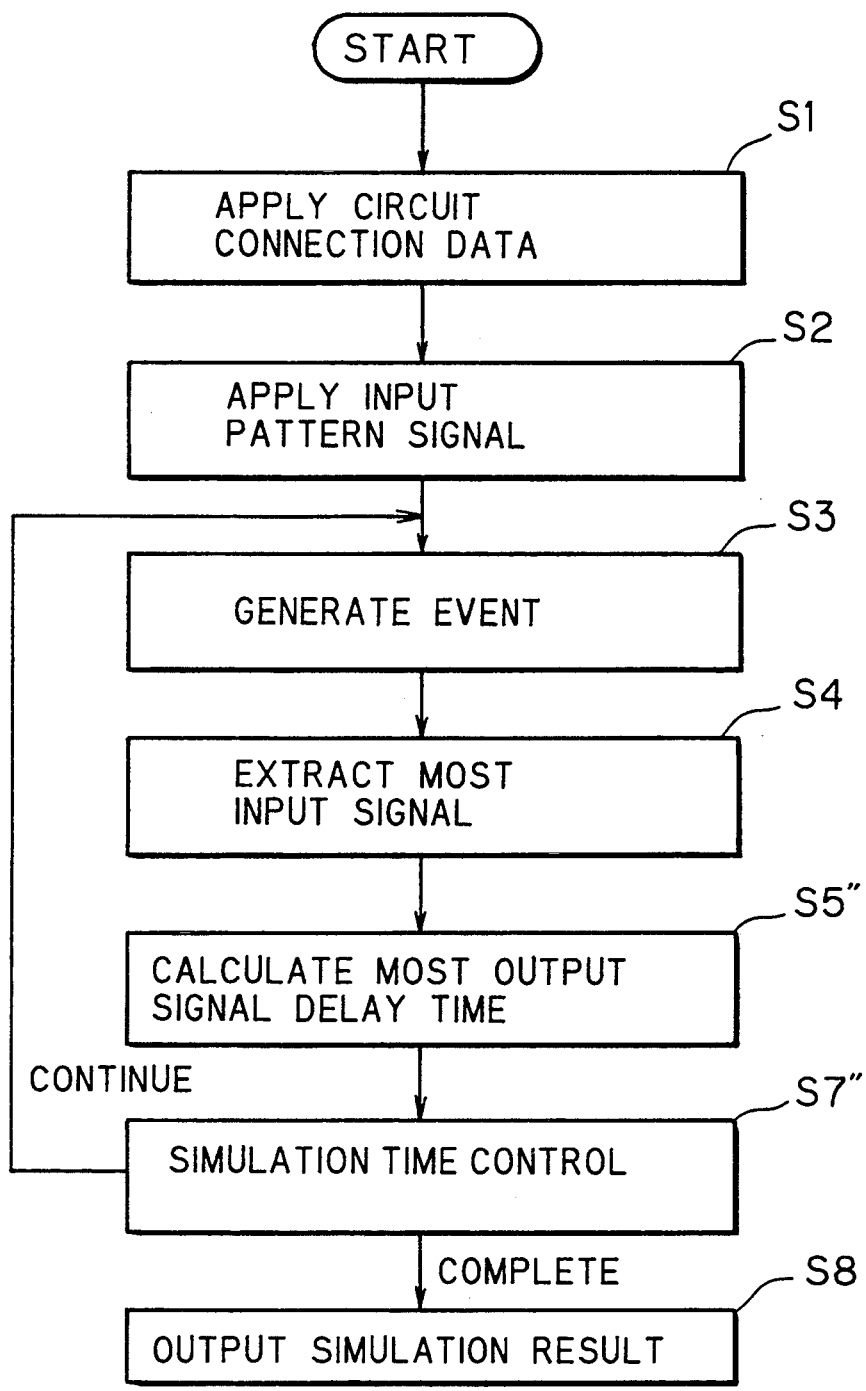
FIGS. 15 to 17 are flow charts of the operation of the logic simulator of the third preferred embodiment.
Figure 16:
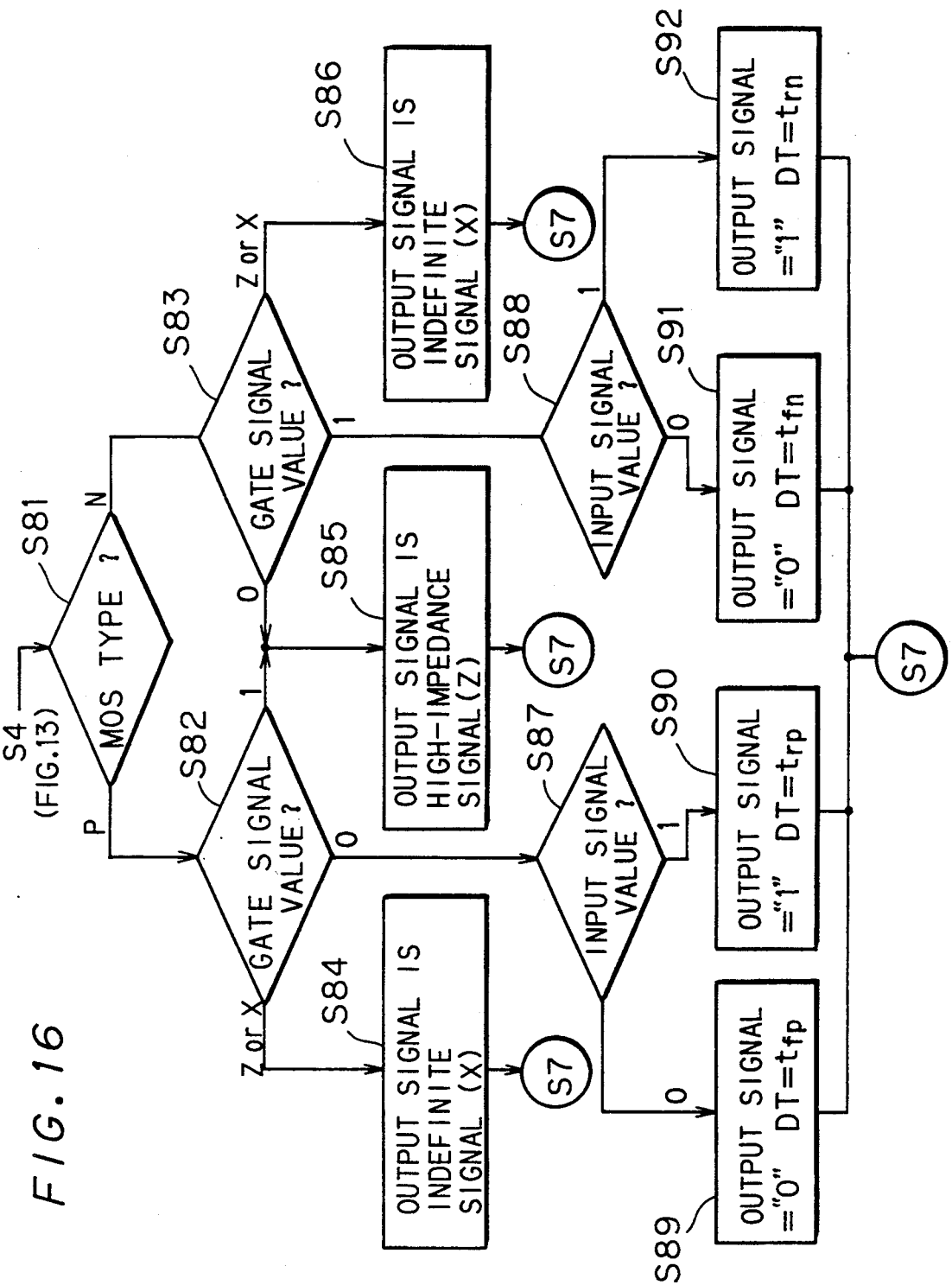
Figure 17:
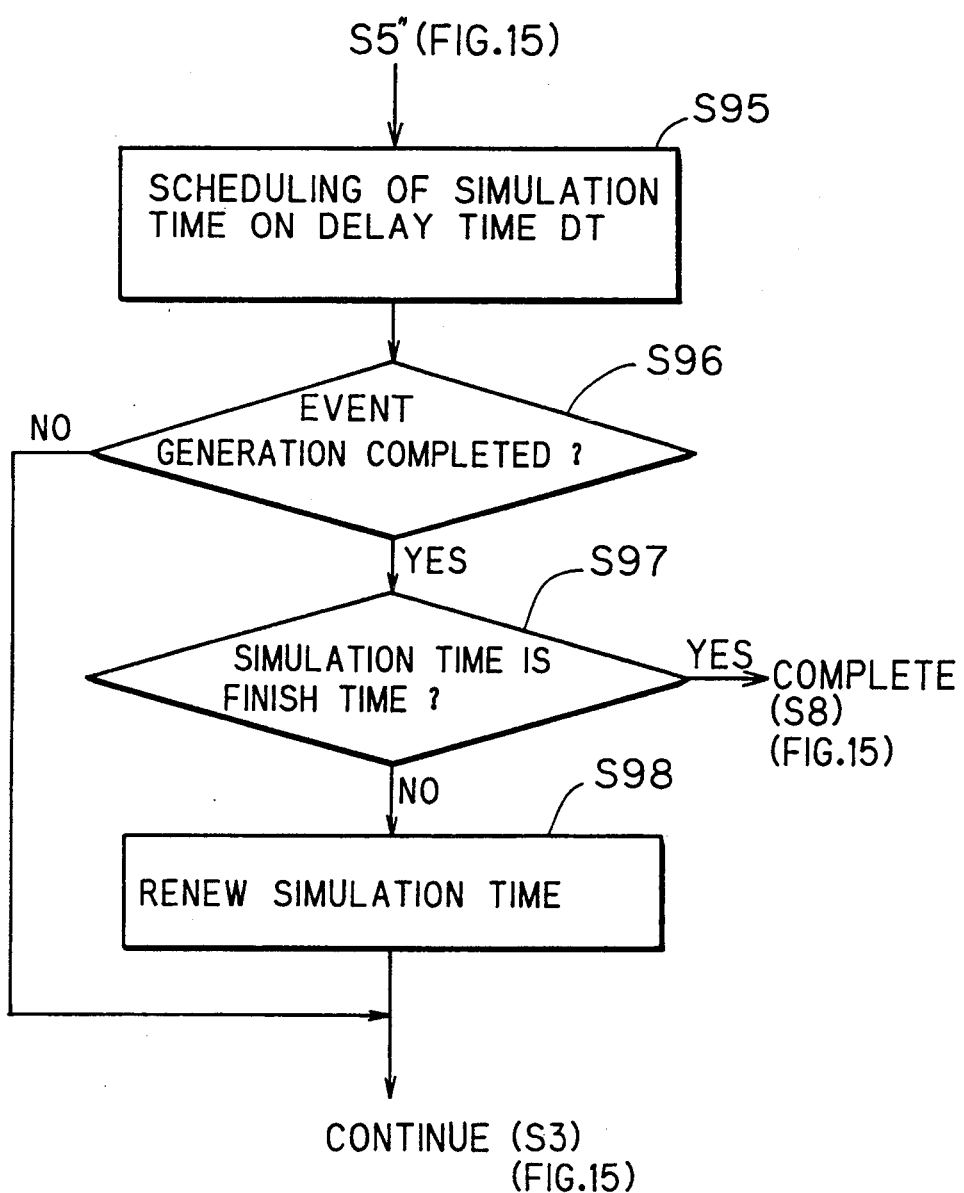

FIGS. 15 to 17 are flow charts of the verification of the circuit operating characteristics by the logic simulator of FIG. 14 according to the third preferred embodiment.

Description will be given on the verification of the circuit operating characteristics by the logic simulator of the third preferred embodiment with reference to FIGS. 15 to 17.

The circuit connection data providing means not shown applies the circuit connection data D1 to the event generator 2 in the step S1. The input pattern signal providing portion 1 applies the input pattern signal D2 which becomes the test pattern to the event generator 2 in the step S2.

In the step S3, the event generator 2 generates the signal value change (or the event) as a function of the input pattern signal D2 on the nets in the logic circuit which are specified by the circuit connection data D1, to output the circuit connection data D3 with event information to the MOST input signal extractor 3.

In the step S4, the MOST input signal extractor 3 extracts the MOS transistor having the input terminal connected to the net in which the event is generated from the circuit connection data D3 while recognizing the conductivity type thereof. The MOST input signal extractor 3 also extracts the signal values applied to the input and gate terminals of the MOS transistor, to output the circuit connection data D4 with MOS input information to the MOST output signal determiner 8.

In the step S5", the MOST output signal determiner 8 determines the output signal value which appears at the output terminal of the MOS transistor as a function of the circuit connection data D4 in consideration for the state transition delay time, to output the circuit connection data D9 with MOS output information to the simulation time controller 6. The output signal value determination in the step S5" is described below with reference to FIG. 16.

The MOS (conductivity) type of the event generation MOST having the input terminal at which the event is generated is identified in the step S81. The process proceeds to the step S82 when the MOS type is P, and the process proceeds to the step S83 when the MOS type is N.

The gate signal value of the P type event generation MOST is judged in the step S82. The process proceeds to the step S84 when the gate signal value is at high impedance (Z) or indefinite (X). The process proceeds to the step S85 when the gate signal value is "1" (at the H level), and proceeds to the step S87 when it is "0" (at the L level). At the same time, the gate signal value of the N type event generation MOST is judged in the step S83. The process proceeds to the step S86 when the gate signal value is at high impedance (Z) or indefinite (X). The process proceeds to the step S85 when the gate signal value is "0", and proceeds to the step S88 when it is "1".

In the steps S84 and S86, the ON/OFF state of the event generation MOST is regarded as indefinite, so that the indefinite signal X is outputted.

When the gate signal value is "0" in the P type event generation MOST, the input signal value is checked to verify the state transition delay time of the event generation MOST in the step S87. When the input signal value is "0", it is used intactly as the output signal value, and the state transition delay time $t_{fp}$ to the signal value "0" of the PMOS transistor indicated in Formula (17) is used as an MOST state transition delay time DT, in the step S89.

When the input signal value is "1" in the step S87, it is used intactly as the output signal value, and the state transition delay time $t_{rp}$ to the signal value "1" of the PMOS transistor indicated in Formula (12) is used as the MOST state transition delay time DT, in the step S90.

When the gate signal value is "1" in the N type event generation MOST, the input signal value is checked to verify the state transition delay time of the event generation MOST in the step S88. When the input signal value is "0", it is used intactly as the output signal value, and the state transition delay time $t_{fn}$ to the signal value "0" of the NMOS transistor indicated in Formula (11) is used as the MOST state transition delay time DT, in the step S91.

When the input signal value is "1" in the step S88, it is used intactly as the output signal value, and the state transition delay time $t_{rn}$ to the signal value "1" of the NMOS transistor indicated in Formula (16) is used as the MOST state transition delay time DT, in the step S92.

The output signal value of the event generation MOST is determined in one of the steps S84 to S86 and S89 to S92. The process then proceeds to the step S7" of FIG. 15.

In the step S7" of FIG. 15, the simulation time controller 6 carries out the simulation time control processing as a function of the circuit connection data D9 with MOS output information in consideration for the MOST state transition delay time DT. When it is necessary to continue the simulation, the simulation time controller 6 resets the simulation time to output the circuit connection data D10 with simulation time to the event generator 2, whereby the continuation of the simulation is instructed. When it is judged that the simulation is completed, the simulation time controller 6 outputs the circuit connection data D9 in the form of the circuit connection data D11 to the simulation result output means not shown, and the process proceeds to the step S8. The simulation time control processing in the step S7" will be described below with reference to FIG. 17.

On receipt of the input signal of the event generation MOST, the simulation time controller 6 performs a scheduling processing such that the output signal is produced after the MOST state transition delay time DT has elapsed, in the step S95.

It is checked in the step S96 whether or not the event generation is completed at the current simulation time. When it is judged that the event generation is not completed, the process proceeds to the step S3 of FIG. 15 to continue the simulation without changing the simulation time.

When it is judged in the step S96 that the simulation is completed, it is checked in the step S97 whether or not the simulation time is the (simulation) finish time. When it is, the process proceeds to the step S8 of FIG. 15 to complete the simulation.

When it is not, the simulation time is put forward in the step S98. The circuit connection data D10 as a function of the renewed simulation time is applied to the event generator 2. The process proceeds to the step S3 of FIG. 15 to continue the logic simulation.

When it is judged to continue the simulation in the step S7", the simulation time is reset (kept in status quo or renewed), and process then returns to the step S3. The event generation, extraction of the input signal of the MOST, determination of the output signal of the MOST with delay time verifying function, on-net signal value processing and simulation time control processing are continued in the steps S3 to S7", until the simulation is regarded as completed in the step S7".

When it is judged in the step S7" that the simulation is completed, the process proceeds to the step S8. In the step S8, the simulation result output means outputs to the CRT not shown or the like the simulation result list including the signal names, event generation time, signal values and the like as a function of the circuit connection data D11 with whole event generation information.

In the logic simulator of the third preferred embodiment, the MOST state transition delay time DT is calculated as a function of the conductivity type and input signal value of the MOS transistor, and the scheduling processing is performed such that the output signal of the MOS transistor is produced just after the state transition delay time has elapsed. As a result, the logic simulator of the third preferred embodiment achieves the logic simulation in consideration for the accurate state transition delay time through the MOST.

Figure 24:
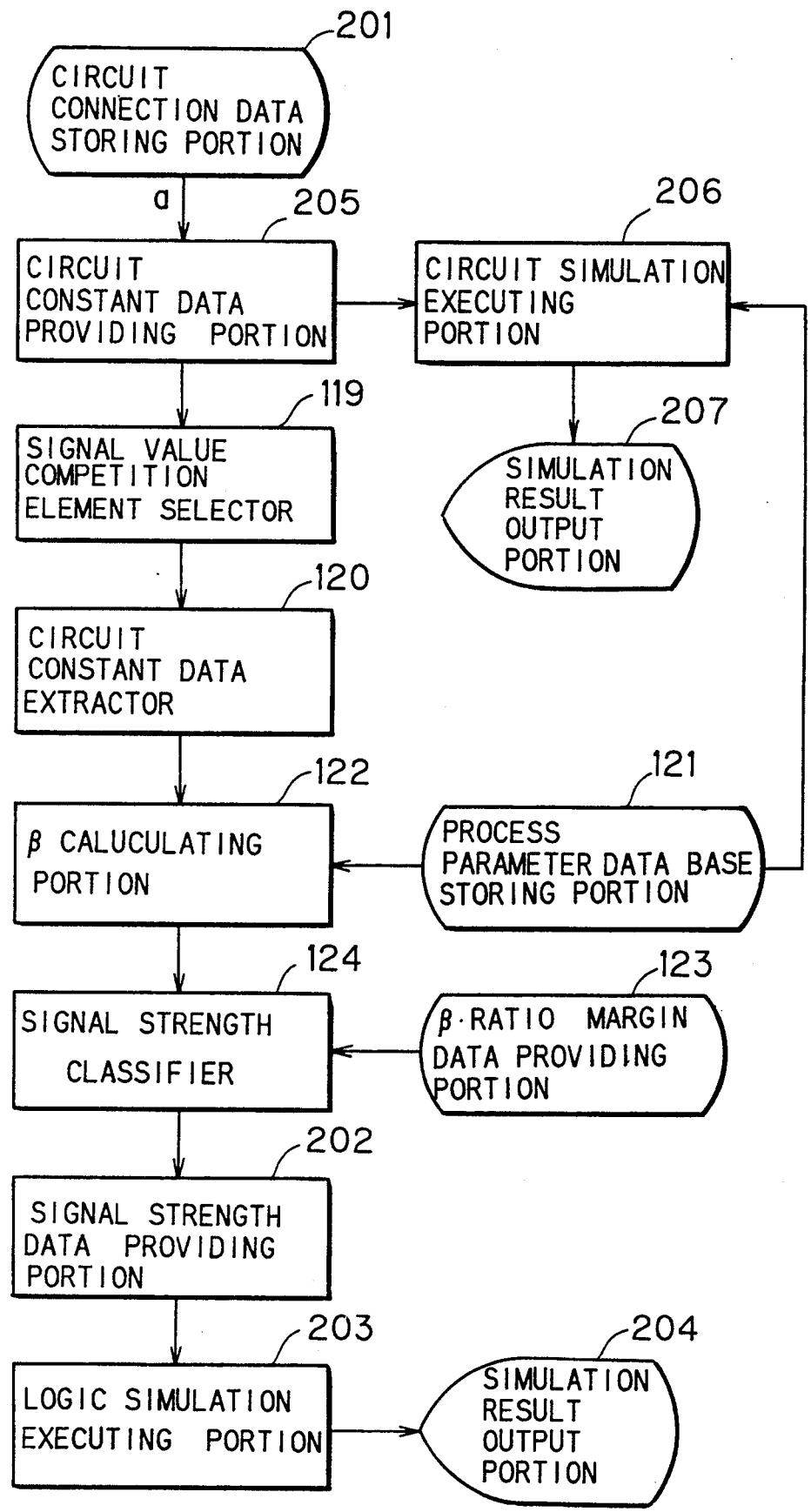
FIG. 24 is a block diagram of the logic simulator according to a fourth preferred embodiment of the present invention.

FIG. 24 is a block diagram of the logic simulator according to a fourth prefered embodiment of the present invention. Reference numeral 201 designates a circuit connection data storing portion provided in a computer and for storing a circuit connection data a equivalent to the logic circuit; 205 designates a circuit constant data providing portion for applying a transistor circuit constant value to the circuit connection data a; 119 designates a signal value competition element selector for selecting a sspecified element group which causes the signal value competition in the circuit connection data; 120 designates a circuit constant data extractor for extracting the transistor circuit constant value applied to the specified elements in the form of a reference circuit constant; 121 designates a process parameter data base storing portion for storing data base for various process parameters required for the fabrication steps of the logic circuit; 122 designates a $\beta$ calculating portion for calculating the transistor gain coefficient $\beta$ as a function of the reference circuit constant and process parameters; 206 designates a circuit simulation executing portion for applying the input signal to the circuit connection data to which the transistor circuit constant value is given to execute circuit simulation; 207 designates a simulation result output portion for outputting the execution result of the circuit simulation; 123 designates a $\beta$ ratio margin data providing portion for providing a $\beta$ ratio margin data (a transistor gain coefficient ratio of a load transistor to a driver transistor which are required for normal operation of a $\beta$ ratio circuit and the like) which is given from the execution result of the circuit simulation; and 124 designates a signal strength classifier for determining the signal strength for the elements composing the specified element group as a function of the magnitude of the gain coefficient $\beta$ values given from the $\beta$ calculating portion 122. The signal strength classifier 124 judges that the circuit (a non-overlapping ratioless circuit) does not cause the signal value competition in terms of timing, to make no level difference of the signal strength. Reference numeral 202 designates a signal strength data providing portion for applying the signal strength to a circuit connection data for logic simulation; 203 designates a logic simulation executing portion for applying the input signal to the circuit connection data for logic simulation to execute the logic simulation at a plural signal strength level; and 204 designates a simulation result output portion for outputting the execution result of the logic simulation.

The function of the fourth preferred embodiment will be discussed with reference to FIGS. 24 to 27, 29 and 30.

Figure 25:
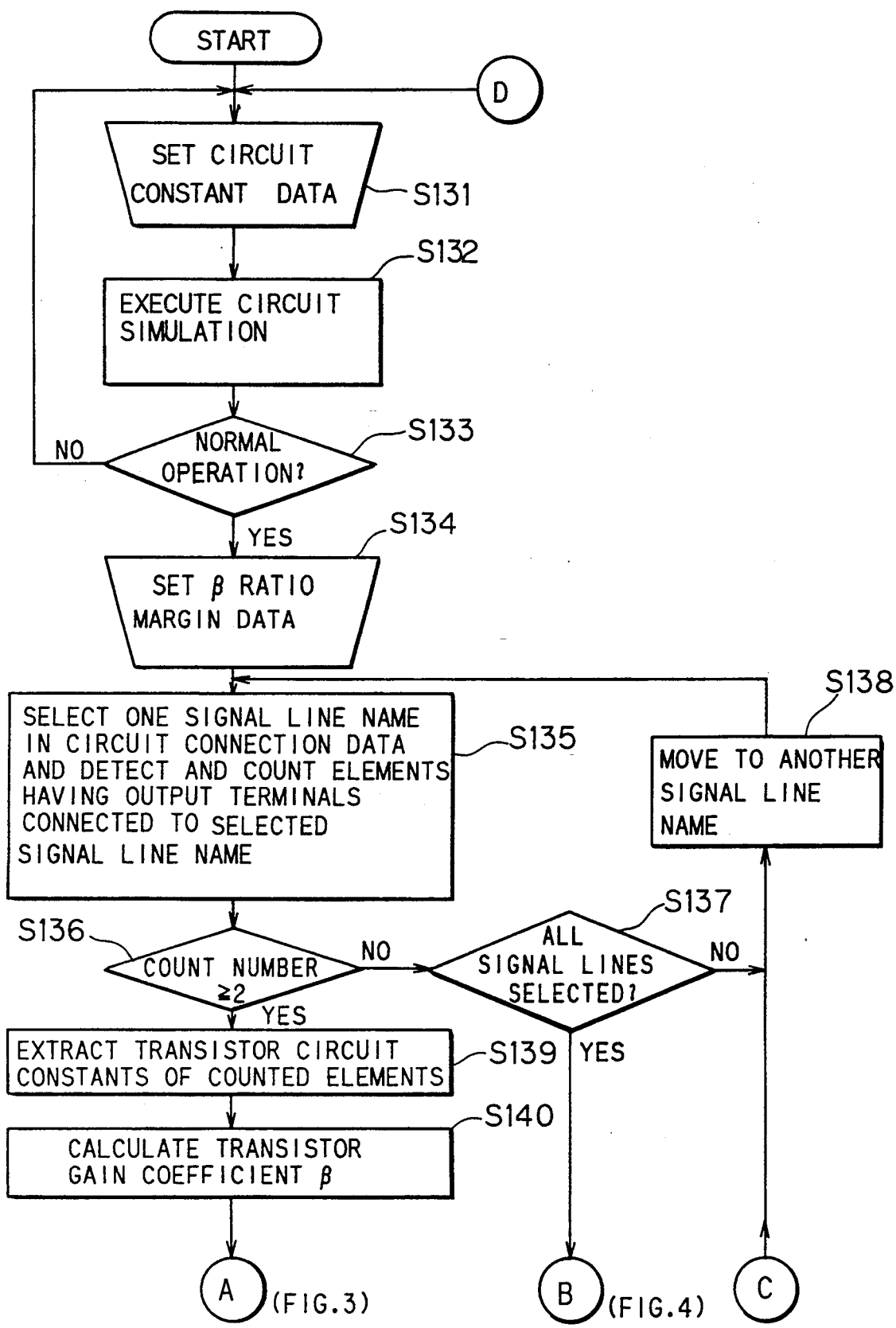
FIGS. 25 to 27 are flow charts of the operation of the logic simulator of the fourth preferred embodiment.
Figure 26:
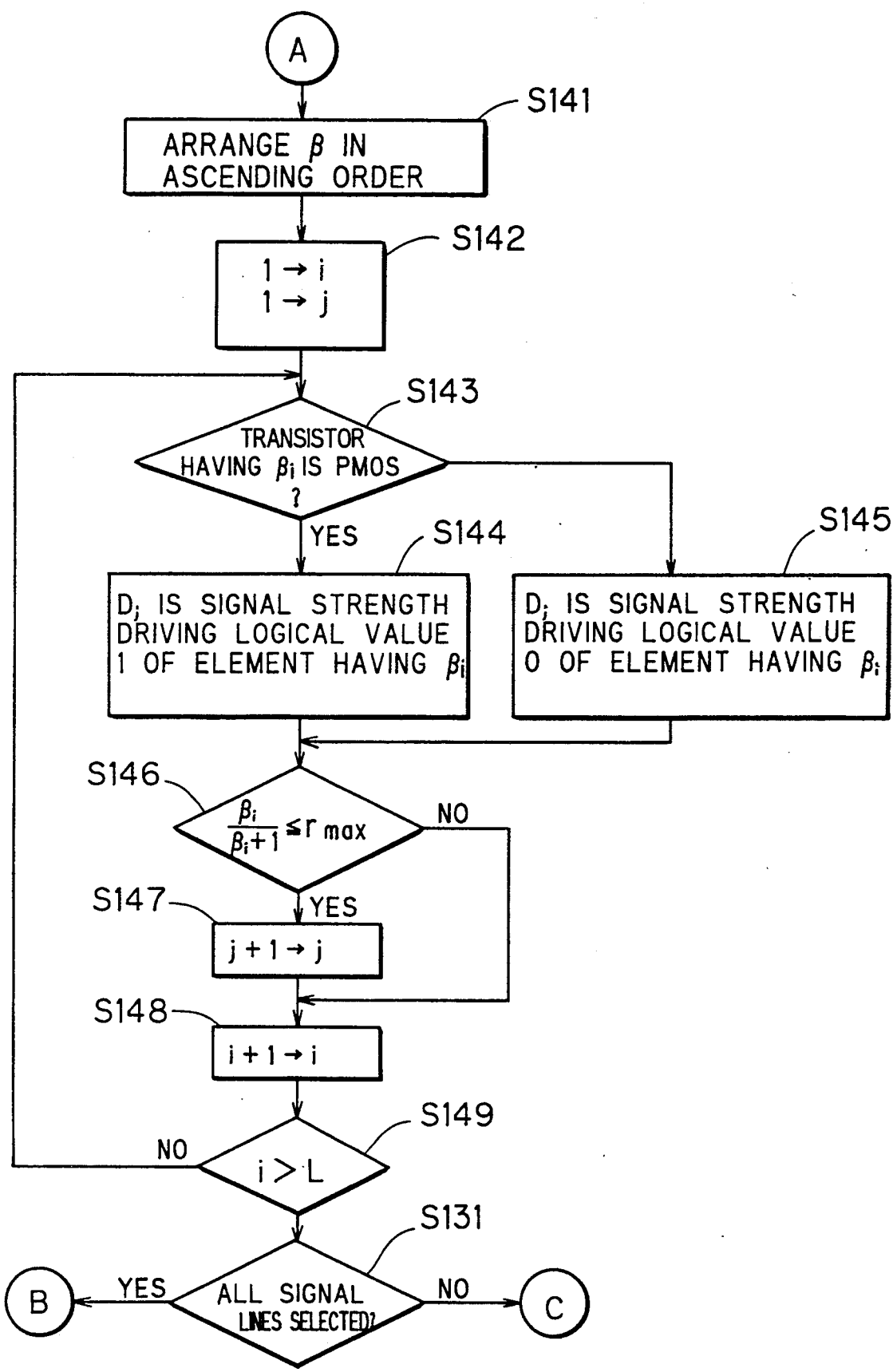
Figure 27:
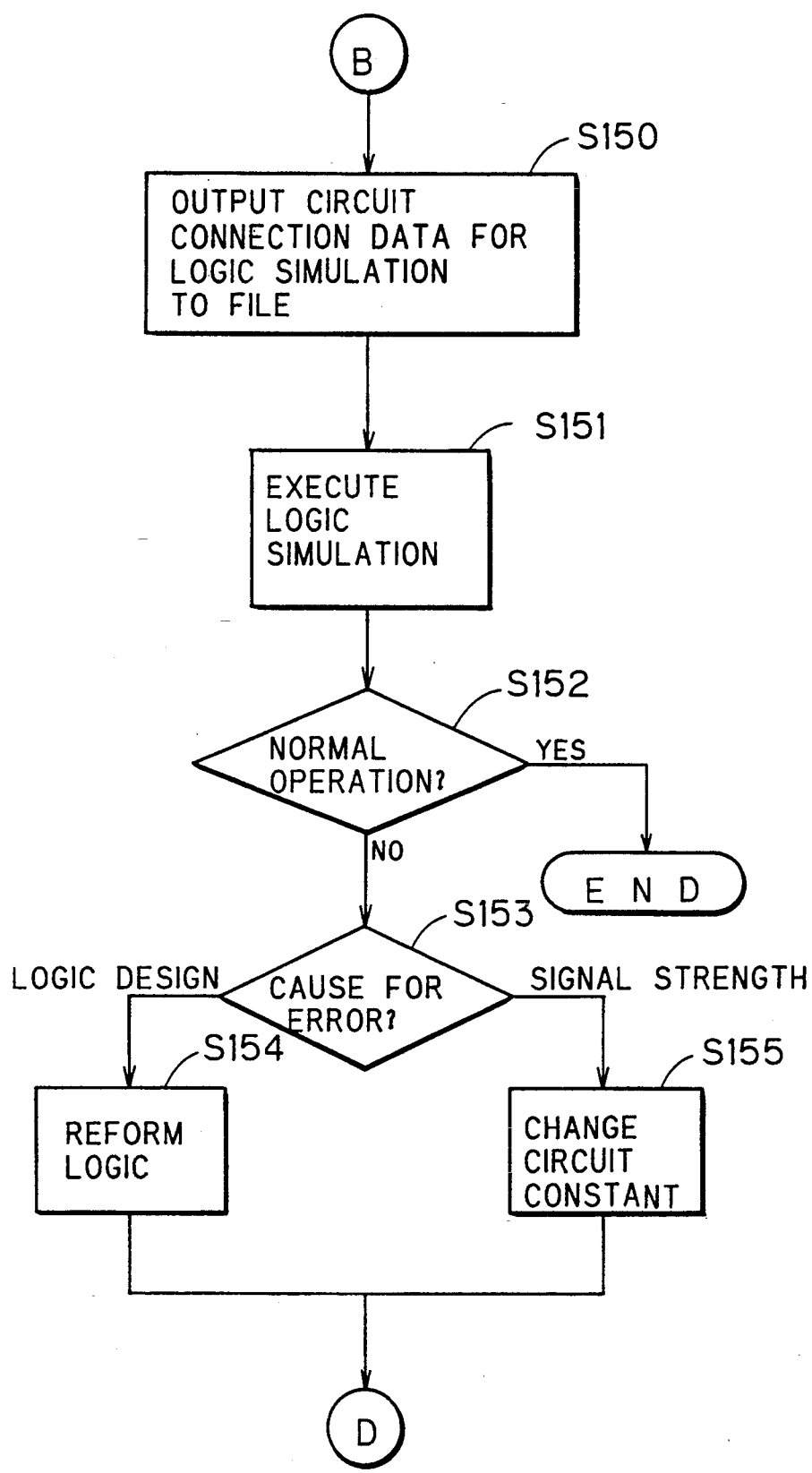
Figure 28:
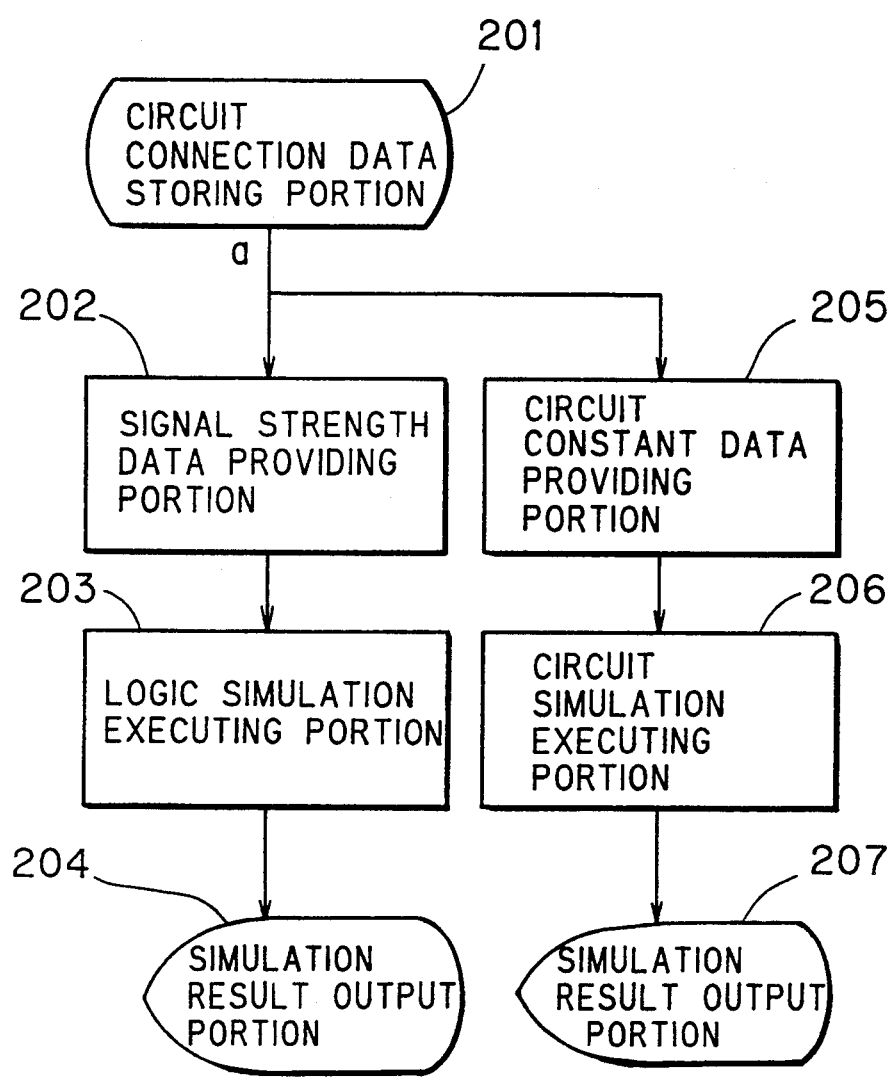
FIG. 28 is a block diagram of another conventional logic simulator.
Figure 29:
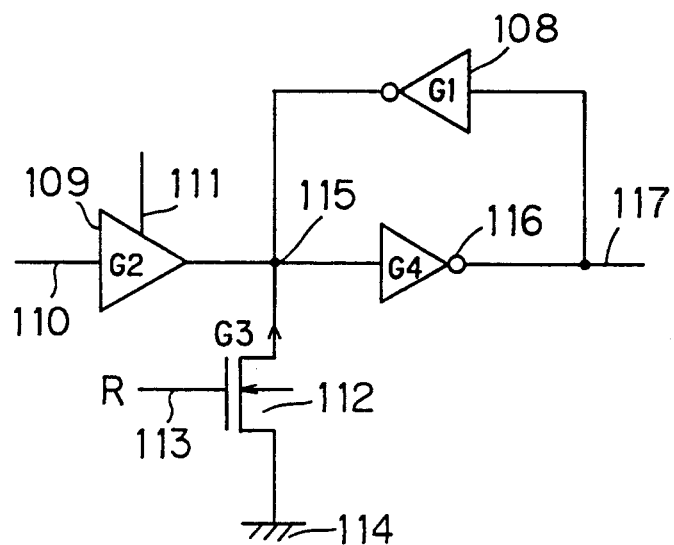
Figure 30:
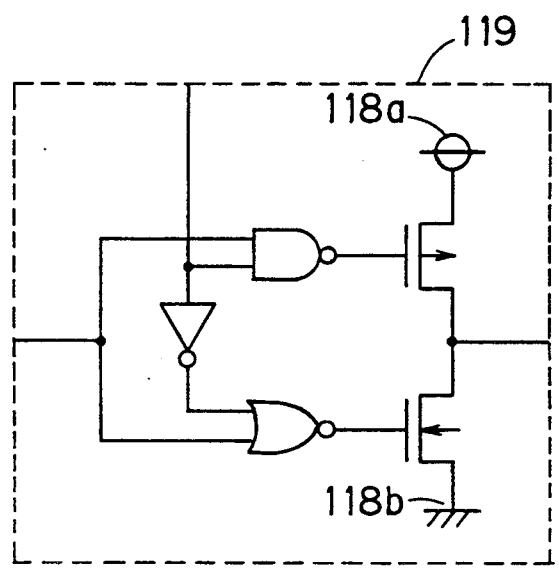

FIGS. 25 to 27 are flow charts of the verification by the logic simulator of the fourth preferred embodiment, and FIGS. 29 and 30 are circuit diagrams of exemplary circuit connection data to be processed.

The transistor circuit constant is manually applied to the components of the circuit connection data a by means of the circuit constant data providing portion 205 in the step S131. In the exemplary circuit of FIG. 29, channel lengths $L_{p1}$, $L_{n1}$ and channel widths $W_{p1}$, $W_{n1}$ of the PMOS and NMOS transistors disposed at the output stage of the element are set to an inverter 108. Similarly, channel lengths $L_{p2}$, $L_{n2}$ and channel widths $W_{p2}$, $W_{n2}$ of the PMOS and NMOS transistors disposed at the output stage thereof are set to a tri state buffer 109. Channel length $L_{n3}$ and channel width $W_{n3}$ of the NMOS transistor are set to the NMOS transistor 112. The various process parameters (e.g., the dielectric constant and thickness of the gate oxide film) required for the fabrication of the logic circuit are applied as the data base to the data base storing portion 121.

The circuit simulation executing portion 206 executes the circuit simulation on a cell block portion of the $\beta$ ratio circuit as a function of the circuit connection data to which the transistor circuit constant is applied and the process parameters, in the step S132.

The output portion 207 verifies the simulation result in the step S133. The maximum ratio $r_{max}$ ($=\beta_L/\beta_D$) of a load transistor gain coefficient $\beta_L$ to a driver transistor gain coefficient $\beta_D$ which are required for the normal operation of the $\beta$ ratio circuit is set to the $\beta$ ratio margin data providing portion 123 in the step S134.

The signal value competition element selector 119 selects one signal line name in the circuit connection data and detects the elements having the output terminals connected to the signal line name from the circuit connection data, to count the number of elements, in the step S135. When the count number is not more than one, it is judged in the step S136 that the signal line does not cause the signal value competition. When all of the signal line names in the circuit connection data have not been selected in the step S137, the selection moves to another signal line which has not been selected in the step S138. When the count number is not less than two, it is judged that the signal line might cause the signal value competition in the step S136, so that the circuit constant data extractor 120 extracts the transistor circuit constants of the counted elements in the step S139. In the exemplary circuit of FIG. 29, the count number of the signal lines 115 is three, so that the transistor circuit constants ($L_{p1}$, $W_{p1}$, $L_{n1}$, $W_{n1}$, $L_{p2}$, $W_{p2}$, $L_{n2}$, $W_{n2}$, $L_{n3}$, $W_{n3}$) of the element group (including the inverter 108, tri state buffer 109, and NMOS transistor 112) having the output terminals connected to the signal lines 115 are extracted.

The $\beta$ calculating portion 122 substitutes the transistor circuit constant values and process parameters in Formula (2) to calculate the gain coefficients of the respective transistors in the step S140.

$$\beta = \frac{\mu\epsilon}{t_{ox}} \cdot \frac{W}{L} \tag{2}$$

It is assumed, in the circuit of FIG. 29, that gain coefficients $\beta_{p1}$ and $\beta_{n1}$ of the PMOS and NMOS transistors are calculated for the inverter 108, that gain coefficients $\beta_{p2}$ and $\beta_{n2}$ are calculated for the try state buffer 109 and that a gain coefficient $\beta_{n3}$ is calculated for the NMOS transistor 112.

The signal strength classifier 124 arranges the calculated $\beta$ values in ascending order in the step S141 as:

$$\beta_1 < \ldots < \beta_i < \ldots \beta_L \tag{18}$$

where $\beta_1$ is the minimum of $\beta$, $\beta_L$ is the maximum of $\beta$, and $\beta_i$ is the i-th $\beta$ from $\beta_1$.

The calculated β values for the circuit of FIG. 29 are arranged as:

$$\beta_{p1} < \beta_{n1} < \beta_{p2} < \beta_{n2} < \beta_{n3} \quad (19)$$

Variables i and j are initialized in the step S142. When the MOS type of the transistor having $\beta_i$ is PMOS in the step S143, the signal strength which drives the logical value 1 of the element in which the transistor is provided at the output stage is set to $D_j$ in the step S144. When the MOS type is NMOS in the step S143, the signal strength which drives the logical value 0 of the element in which the transistor is provided at the output stage is set to $D_j$ in the step S145. The value $D_j$ relatively representative of the charge supply capability for the logic simulation, can be set for one element model separately between the logical values 1 and 0. The relative relation of the signal strengths $D_j$ from "weak" to "strong" is as follows:

$$D_1 < \ldots < D_j < \ldots < D_{max} \quad (20)$$

where $D_1$ is the minimum signal strength, $D_{max}$ is the maximum signal strength, and $D_j$ is the j-th signal strength from $D_1$. In this manner, the signal strengths $D_1$ to $D_{max}$ are assigned to the elements causing the signal value competition in order of the β values in the step S148. When the ratio of the i-th gain coefficient $\beta_i$ to the (i+1)-th gain coefficient $\beta_{i+1}$ is larger than the maximum $r_{max}$ of the β ratio margin data, the increment of the counter variable j for signal strength in the step of S147 is bypassed in the step S146, whereby the level different in signal strength is not made between the transistors having $\beta_i$ and $\beta_{i+1}$. Although this processing might cause the signal value competition in terms of circuit connection, it is judged that the circuit does not cause the signal value competition in terms of timing. If the signal value competition at the same strength level should occur during the logic simulation in the circuit in which no level difference in signal strength is made in this processing so that the circuit operates abnormally, the error results from errors in designing the circuit and is detected by the simulator of the present invention.

In the circuit of FIG. 29, the PMOS and NMOS transistors in the inverter 108 and the PMOS and NMOS transistors at the output stage of the try state buffer 109 are no-overlapping ratioless circuits therein, in which $\beta_{p1} \approx \beta_{n1}$ and $\beta_{p2} \approx \beta_{n2}$ hold Therefore, the signal strengths which drive the logical values 1 and 0 are set to $D_1$ (weak) for the inverter 108 from Formula (19). The signal strengths which drive the logical values 1 and 0 are set to $D_2$ (medium) for the try state buffer 109. The signal strength which drives the logical value 0 is set to $D_3$ (strong) for the NMOS transistor 112.

The signal strength classification is performed for all of the signal value competition signal lines in the circuit connection data in the step S137. Thereafter, the signal strength data providing portion 202 applies the signal strength data to the respective elements in the circuit connection data, and then outputs the circuit connection data for logic simulation to a file in the step S150.

The logic simulation executing portion 203 applies the input signal to the circuit connection data for logic simulation, to perform the logic simulation at the plural signal strength level in the step S151. The simulation result is verified in the output portion 204 of FIG. 24.

When the circuit to be processed is not normally operated in the step S152, the process proceeds to the step S153. The logic is reformed in the step S154 when the abnormal operation results from the logic itself in the step S153. The transistor size is changed in the step S155 when it results from the signal strength. The process then returns to the step S131 for setting the circuit constant data.

The transistor circuit constants are manually applied in the circuit constant data providing portion in the fourth preferred embodiment. The circuit connection information and transistor circuit constant data may be extracted from the layout pattern data whereby the logic simulation is executable. In the β ratio margin data comparison in the signal strength classifier 124 (in the step S146), a function may be additionally provided to output a warning message that the signal value competition might occur where the the set value $r_{max}$ is not satisfied, to thereby prompt a change in transistor size before the execution of the logic simulation.

While the invention has been shown and described in detail, the foregoing description is in all aspects illustrative and not restrictive. It is therefore understood that numerous modifications and variations can be devised without departing from the scope of the invention.

What is claimed is:

1. A logic simulator for verifying a circuit operation of a logic circuit including MOS transistors, said logic simulator comprising:
    circuit connection data providing means for providing a circuit connection data specifying circuit connections in said logic circuit;
    input pattern signal providing means for applying an input pattern signal to an input portion of said logic circuit;
    event generating means for generating a signal value change (an event) at input and output portions of elements of said logic circuit in said circuit connection data as a function of said input pattern signal to output a circuit connection data with event generation;
    MOS transistor input signal extracting means for extracting an MOS transistor having input and control terminals at which the event is generated as a function of said circuit connection data with event generation to output said MOS transistor as an event generation MOS transistor (an event generation MOST);
    MOS transistor output signal strength determining means for detecting said event generation MOST which is turned on as a function of a conductivity type of said event generation MOST and a control signal value given from said control terminal to determine an output signal strength which is a drive capability of an output signal given from an output terminal when said event generation MOST is turned on as a function of an input signal value; and
    wiring signal value determining means for detecting an MOST output wiring connected to said output terminal of said event generation MOST and comparing a signal strength of said output signal determined on said output signal strength with a signal strength of another signal to be applied to said MOST output wiring where said MOST output wiring is in a signal competing condition to determine a signal value of said MOST output wiring.

2. The logic simulator of claim 1, wherein said MOS transistor output signal strength determining means includes output signal determining means for determining an output signal value given from said output terminal as a function of the conductivity type of said event generation MOST, said input signal value given from said input terminal and said control signal value given from said control terminal.

3. The logic simulator of claim 2, wherein said MOS transistor output signal strength determining means makes the signal strength of said output signal value lower than that of said input signal value where said event generation MOST is of P type and said control and input signal values are "0" (at L level).

4. The logic simulator of claim 2, wherein said MOS transistor output signal strength determining means makes the signal strength of said output signal value lower than that of said input signal value where said event generation MOST is of N type and said control and input signal values are "1" (at H level).

5. A logic simulator for verifying a circuit operation of a logic circuit including MOS transistors, said logic simulator comprising:
    circuit connection data providing means for providing a circuit connection data specifying circuit connections in said logic circuit;
    input pattern signal providing means for applying an input pattern signal to an input portion of said logic circuit;
    event generating means for generating a signal value change (an event) at input and output portions of elements of said logic circuit in said circuit connection data as a function of said input pattern signal to output a circuit connection data with event generation;
    MOS transistor input signal extracting means for extracting an MOS transistor having input and control terminals at which the event is generated as a function of said circuit connection data with event generation to output said MOS transistor as an event generation MOS transistor (an event generation MOST); and
    MOS transistor output signal level determining means for detecting said event generation MOST which is turned on as a function of a conductivity type of said event generation MOST and a control signal value given from said control terminal to determine an output signal level given from an output terminal when said event generation MOST is turned on as a function of an input signal value, said MOS transistor output signal level determining means verifying the presence of the danger that a through current is generated in said event generation MOST as a function of said conductivity type and a signal level of said control signal value of said event generation MOST.

6. The logic simulator of claim 5, wherein said MOS transistor output signal level determining means sets said output signal level to a threshold level where said event generation MOST is of P type and said control and input signal values are "0".

7. The logic simulator of claim 6, wherein said MOS transistor output signal level determining means gives a warning for the danger that the through current is generated where said event generation MOST is of P type and where said control signal value is "1" and said signal level thereof is said threshold level.

8. The logic simulator of claim 5, wherein said MOS transistor output signal level determining means sets said output signal level to a threshold level where said event generation MOST is of N type and said control and input signal values are "1".

9. The logic simulator of claim 6, wherein said MOS transistor output signal level determining means gives a warning for the danger that the through current is generated where said event generation MOST is of N type and where said control signal value is "0" and said signal level thereof is said threshold level.

10. A logic simulator for verifying a circuit operation of a logic circuit including MOS transistors, said logic simulator comprising:
    circuit connection data providing means for providing a circuit connection data specifying circuit connections in said logic circuit;
    input pattern signal providing means for applying an input pattern signal to an input portion of said logic circuit;
    event generating means for generating a signal value change (an event) at input and output portions of elements of said logic circuit in said circuit connection data as a function of said input pattern signal to output a circuit connection data with event generation;
    MOS transistor input signal extracting means for extracting an MOS transistor having input and control terminals at which the event is generated as a function of said circuit connection data with event generation to output said MOS transistor as an event generation MOS transistor (an event generation MOST);
    MOS transistor output signal delay time determining means for detecting said event generation MOST which is turned on as a function of a conductivity type of said event generation MOST and a control signal value given from said control terminal to determine a state transition delay time of an output signal given from an output terminal from an input signal when said event generation MOST is turned on as a function of an input signal value; and
    simulation time control means for controlling a signal generation timing of said output signal of said event generation MOST as a function of said state transition delay time.

11. The logic simulator of claim 10, wherein said MOS transistor output signal delay time determining means includes output signal determining means for determining an output signal value given from said output terminal as a function of a conductivity type of said event generation MOST, said input signal value given from said input terminal and said control signal value given from said control terminal.

12. The logic simulator of claim 11, wherein said MOS transistor output signal delay time determining means sets said state transition delay time where said input signal value is "0" longer than said state transition delay time where said input signal value is "1" when the event generation MOST is of P type and said control signal value is "0".

13. The logic simulator of claim 11, wherein said MOS transistor output signal delay time determining means sets said state transition delay time where said input signal value is "1" longer than said state transition delay time where said input signal value is "0" when said event generation MOST is of N type and said control signal value is "1".

14. A logic simulator for constructing a circuit connection data in the form of a logic circuit model equivalent to a logic circuit and performing a logic simulation as a function of an input signal trigger to be applied from the exterior of said logic circuit to verify the design of said logic circuit, said logic simulator comprising:

circuit constant data providing means for applying a transistor circuit constant data to elements constituting said circuit connection data;

element selecting means for selecting a specified element group causing a signal value competition in said circuit connection data as elements to which a signal strength data is to be set;

data extracting means for extracting said transistor circuit constant data applied to said specified elements as a reference circuit constant;

$\beta$ calculating means for calculating transistor gain coefficients $\beta$ as a function of said reference circuit constant and process parameters for fabrication of said logic circuit;

classifying means for determining signal strength data for respective elements of said specified element group as a function of the magnitude of said gain coefficients $\beta$;

signal strength data providing means for setting said signal strength data to a circuit connection data for logic simulation; and logic simulation executing means at a plural signal strength level for applying an input signal to said circuit connection data for logic simulation to execute the logic simulation.

15. The logic simulator of claim 14, wherein said circuit constant data contains channel length and width of an MOS transistor.

16. The logic simulator of claim 15, wherein said process parameters contains dielectric constant and thickness of a gate oxide film of the MOS transistor.

* * * * *